United States Patent
Momota et al.

(10) Patent No.: US 8,091,218 B2
(45) Date of Patent: Jan. 10, 2012

(54) METHOD OF MANUFACTURING A RIGID PRINTED WIRING BOARD

(75) Inventors: Atsushi Momota, Tokyo (JP); Ichiro Terunuma, Tokyo (JP); Takeshi Hasegawa, Tokyo (JP); Yasuo Takemura, Tokyo (JP); Yoshifumi Hatakeyama, Sendai (JP); Hiroshi Harada, Tokyo (JP); Makoto Katoh, Tokyo (JP)

(73) Assignees: Fujikura Ltd., Tokyo (JP); Kyoei Electric Co., Ltd., Tokyo (JP)

( * ) Notice: Subject to any disclaimer, the term of this patent is extended or adjusted under 35 U.S.C. 154(b) by 966 days.

(21) Appl. No.: 11/989,679

(22) PCT Filed: Jul. 28, 2006

(86) PCT No.: PCT/JP2006/314995
§ 371 (c)(1),
(2), (4) Date: Mar. 19, 2008

(87) PCT Pub. No.: WO2007/013595
PCT Pub. Date: Feb. 1, 2007

(65) Prior Publication Data
US 2010/0294544 A1 Nov. 25, 2010

(30) Foreign Application Priority Data
Jul. 29, 2005 (JP) .................................. 2005-221031

(51) Int. Cl.
*H05K 3/00* (2006.01)

(52) U.S. Cl. ................ 29/829; 29/830; 29/831; 29/832; 29/846; 29/852

(58) Field of Classification Search .............. 29/829, 29/830, 831, 832, 846, 852, 853; 174/354, 174/255, 261, 162; 428/209, 901; 361/777, 361/778, 779
See application file for complete search history.

(56) References Cited

U.S. PATENT DOCUMENTS
5,103,293 A 4/1992 Bonafino et al.
(Continued)

FOREIGN PATENT DOCUMENTS
| EP | 0 534 290 | 3/1993 |
|---|---|---|
| JP | 57-195862 | 12/1982 |
| JP | 61-134246 | 6/1986 |
| JP | 62-185396 | 8/1987 |

(Continued)

OTHER PUBLICATIONS

Jan. 1, 1997 "Ridgid Printed Circuit Board with Integrated Flexible Bend Areas." Gary L. Christopher. Motorola Technical Developments, Motorola, Inc. pp. 65-66.

*Primary Examiner* — Derris Banks
*Assistant Examiner* — Tai Nguyen
(74) *Attorney, Agent, or Firm* — Jordan and Hamburg LLP

(57) ABSTRACT

Provided is a bending rigid printed wiring board which facilitate the mounting of electric parts (realization of a high producibility and high assemblability substrate circuit) and enables spaces to be saved and which can be easily manufactured.

That is, provided is a bending rigid printed wiring board, which is characterized in that a heat resistant resin layer is laminated on a front surface of a hard core material provided so as to contain a gap portion and also on a top surface of the gap portion, in that a heat resistant resin layer is laminated on a rear surface of the core material except the gap portion, in that a conductor layer is laminated and firmly fixed via the heat resistant resin layers and in that the conductor layer is etched, whereby a circuit is formed.

2 Claims, 17 Drawing Sheets

U.S. PATENT DOCUMENTS

| | | | |
|---|---|---|---|
| 5,827,604 A * | 10/1998 | Uno et al. | 428/209 |
| 5,903,440 A | 5/1999 | Blazier et al. | |
| 6,629,366 B1 * | 10/2003 | Kobayashi | 29/846 |
| 6,664,127 B2 * | 12/2003 | Oka et al. | 438/64 |
| 7,662,921 B2 * | 2/2010 | Adelman et al. | 530/350 |

FOREIGN PATENT DOCUMENTS

| | | |
|---|---|---|
| JP | 9-199816 | 7/1997 |
| JP | 09-199816 | 7/1997 |
| JP | 2004-192546 | 7/2004 |
| JP | 2004-319962 | 11/2004 |

* cited by examiner

Fig. 16(a)          RELATED ART
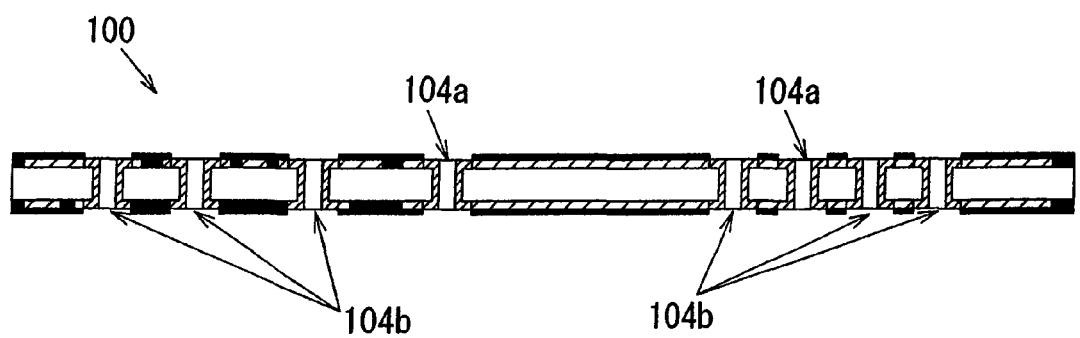
Fig. 16(b)          RELATED ART
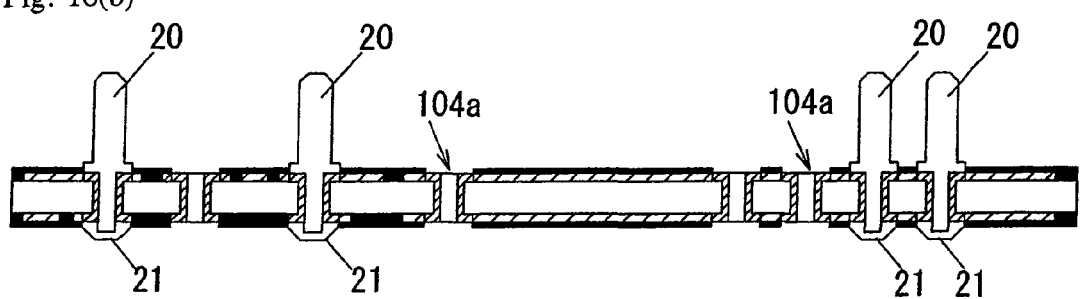
Fig. 16(c)          RELATED ART
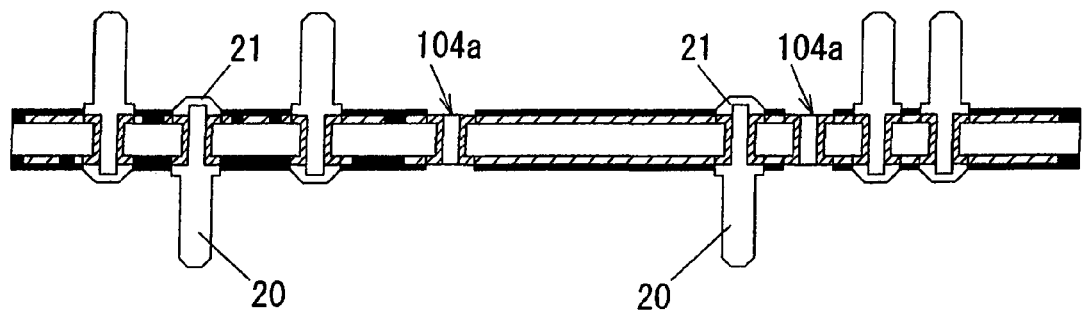

RELATED ART

METHOD OF MANUFACTURING A RIGID PRINTED WIRING BOARD

BACKGROUND OF THE INVENTION

The present invention relates to a printed wiring board which permits easy mounting of electrical parts and the like and which not only enables spaces to be saved, but also facilitates manufacturing.

Electrical components tend to increase in number from the requirements for an improvement in the functions of products of, for example, automobiles. For this reason, in order to use limited spaces efficiently, it is required that electrical parts and the like be easily mounted and that spaces necessary for their mounting be reduced.

Therefore, in performing the wiring and branching of electric wires for automobiles and the like, there has been used an electric connection box which is constructed so that parts, such as connections to wire harness, fuses and relays, are collected in one place and connected there. And as the above-described electric connection box, there has been known an electric connection box in which a rigid printed wiring board that is constructed in such a manner that a circuit is formed on the surface of a hard base material is used as a wiring material for distributing power from a power source (hereinafter referred to as an internal circuit).

A method of manufacturing a rigid printed wiring board 100 by prior art will be described with reference to FIGS. 15(a) to 15(c).

According to the prior art, a laminate 103 which is obtained by laminating a conductor layer 102, such as copper foil and silver foil, each on a front surface and a rear surface of a hard base material 101 made of an insulating material, is used (refer to FIG. 15(a)), and through holes 104 (a via through hole 104a which ensures electrically conducting properties for the conductor layers 102 on the front and rear surfaces and a mounting through hole 104b for providing a connection terminal 20) are formed by planting a substrate through-hole provided by drilling the laminate 103. At the same time, by etching the above-described laminate 103, a circuit 102a is formed on the front and rear surfaces of the hard base material 101 (refer to FIG. 15(b)), and the front surface of the circuit is coated with a resist (an insulating material) 105, whereby a rigid printed wiring board 100 is manufactured (refer to FIG. 15(c)). Also, a multilayer wiring board has been similarly manufactured by performing laminating and pressing.

In a case where by use of the prior art, an electrical part is mounted on the rigid printed wiring board 100 and a wiring material (a substrate circuit) of an internal circuit as used in electrical equipment is formed, as shown in FIGS. 16(a) to 16(c), the mounting through hole 104b for the insertion of the connection terminal 20 is provided beforehand in a connector for the connection to the electrical part and a connection to the electrical part, such as a fuse and a relay. After the press fitting of the connection terminal 20 into the above-described mounting through hole 104b, the rigid printed wiring board 100 and the connection terminal 20 are connected together after going through the step of flow soldering or reflow soldering.

As shown in FIG. 16(a), in connecting the connection terminal 20 to the rigid printed wiring board 100 which is provided with the via through hole 104a for ensuring the conducting properties of the circuits formed on the front and rear surfaces of the substrate and the mounting through hole 104b into which the connection terminal 20 is press fitted, because the above-described mounting through hole 104b is formed from a hole which pierces through the substrate, in a case where a substrate circuit in which the connection terminals 20 are provided at prescribed positions each on the front surface and rear surface of the substrate, it is necessary to design a substrate circuit in such a manner that the positions of the connection terminals 20 do not overlap on the front and rear surfaces. Therefore, the prior part had the disadvantage that the projected area of the substrate circuit becomes large.

In forming a substrate circuit in which the connection terminals 20 are provided at prescribed positions each on the front surface and rear surface of the substrate, it was necessary to solder the connection terminals 20 by performing the step of fixing the connection terminals 20 provided at prescribed positions on the front surface of the rigid printed wiring board 100 by solders 21 as shown in FIG. 16(b), and the step of fixing the connection terminals 20 provided at prescribed positions on the rear surface of the rigid printed wiring board 100 by solders 21 as shown in FIG. 16(c). That is, it has been necessary to perform the soldering step twice.

Therefore, as shown in FIGS. 17(a) and 17(b), there have been proposed techniques which involve connecting two rigid printed wiring boards 100, in each of which a connection terminal 20 is provided at a prescribed position on a front surface, by means of an electric wire 107, and bending the two rigid printed wiring boards 100 in an electric wire portion, whereby a substrate circuit in which the connection terminals 20 are provided at prescribed positions on both surfaces is obtained (refer to Patent Document 1, for example).

[Patent Document 1] Japanese Patent Application No. 2004-192546

SUMMARY OF THE INVENTION

In a substrate circuit which is formed in such a manner that two rigid printed wiring boards 100 connected together by an electric wire 107 are bent in the above-described electric wire portion, connection terminals 20 which are provided at prescribed positions on each of the front surfaces of the two rigid printed wiring boards 100 connected together by the electric wire 107 are soldered and fixed (refer to FIG. 17(a)), and after that, the two rigid printed wiring boards 100 are bent in the above-described electric wire portion, whereby a substrate circuit in which the connection terminals are provided at prescribed positions on both surfaces is obtained (refer to FIG. 17(b)). Therefore, it is necessary only that the soldering step for fixing the connection terminals 20 be performed once and besides the connection terminals 20 can be provided at arbitrary positions on both surfaces of the substrate.

However, it is necessary to install the electric wire 107 in such a manner that the circuits of the two rigid printed wiring boards 100 are connected together, and it takes time to perform this wire installation step. At the same time, the larger the number of the electric wires 107 for connecting the circuits of the substrates, the more difficult to bend the two rigid printed wiring boards in the electric wire portion will be. Besides the prior art has had the disadvantage that the space occupied by the electric wire 107 after the bending becomes large. Furthermore, because it is difficult to completely make equal the length of each of the electric wires 017 which connect the circuits of the two rigid printed wiring boards 100, it has been difficult to uniformly control the shape after the bending.

In the present invention, therefore, in a rigid printed wiring board which is formed in such a manner that an arbitrary circuit is formed on a front surface of a hard base material by etching a laminate, a bent portion obtained by partially reducing the thickness of the base material is provided so that the rigid printed wiring board can be bent in this bent portion.

Also, a circuit for large current (for example, an inner circuit of an electric connection box) and a circuit for small current (for example, an electronic circuit) are formed in a bending rigid printed wiring board, whereby the substrate performance can be improved.

In a bending rigid printed wiring board of the present invention, a heat resistant resin layer is laminated on a front surface of a hard core material provided so as to contain a gap portion and also on a top surface of the gap portion, a heat resistant resin layer is laminated on a rear surface of the core material except the gap portion, a conductor layer is laminated and firmly fixed via the heat resistant resin layers, and the conductor layer is etched, whereby a circuit is formed.

Conductor portions having different layer thicknesses are formed on the same surface of the conductor, whereby a circuit for large current and a circuit for small current are formed on the same substrate.

A method of manufacturing a bending rigid printed wiring board of the present invention comprises a step of burying a heat resistant resin material in a gap portion provided in a hard core material, a step of forming a laminate by laminating a conductor layer each on a front surface and a rear surface of the hard core material via heat resistant resin layers and performing hot pressing, a step of forming a circuit on the front surface and rear surface of the hard base material by etching the laminate and of removing the conductor layer on the rear surface of the gap portion of the hard core material, and a step of removing the heat resistant resin material buried in the gap portion along with the heat resistant resin material on the rear surface of the heat resistant resin material, whereby a bent portion obtained by partially reducing the thickness of the hard base material is formed. A rigid printed wiring board capable of being bent in the bent portion is obtained by performing the steps.

According to a bending rigid printed wiring board of the present invention, by providing a bent portion obtained by partially reducing the thickness of the hard base material, it is possible to bend the printed wiring board in the bent portion.

In a case where an electrical part is mounted on the bending rigid printed wiring board of the present invention and a wiring material (a substrate circuit) of an internal circuit as used in electrical equipment is formed, after the provision of connection terminals at prescribed positions on a front surface of the rigid printed wiring board, the rigid printed wiring board is bent in the above-described bent portion, whereby it is possible to obtain a substrate circuit in which the connection terminals are provided on both surfaces. Therefore, the installation positions of the connection terminals can be arbitrarily designed and the soldering step of the connection terminals is performed only once. Furthermore, unlike a substrate circuit in which two rigid printed wiring boards connected together by an electric wire are bent in the electric wire portion, one rigid printed wiring board is bent in a bent portion obtained by partially reducing the thickness of a hard base material and, therefore, it is unnecessary to install electric wires for connecting together the circuits of opposed substrate surfaces.

Furthermore, in the bending rigid printed wiring board of the present invention, a gap portion is formed beforehand in part of the hard core material and a heat resistant resin material is buried in this gap portion. And at the same time, a laminate which is obtained by laminating a conductor layer on the front surface and rear surface of the hard core material via a heat resistant resin layer is used, and a heat resistant resin material buried in the gap portion is removed from the above-described laminate, whereby it is possible to easily form a bent portion which is obtained by partially reducing the thickness of the hard base material. Unlike a rigid-flexible substrate of multilayer structure which is constituted by multiple layers of a polyimide film and the like, which have different properties, and combines a flexible portion and a rigid portion, the bending rigid printed wiring board is simple in construction and can be manufactured at low cost.

Moreover, in manufacturing the bending rigid printed wiring board, conductor portions having different layer thicknesses are formed on the same surface of the conductor layer and a circuit for large current (for example, an inner circuit of an electric connection box) and a circuit for small current (for example, an electronic circuit) are formed, whereby it is possible to improve the substrate performance.

BRIEF DESCRIPTION OF THE DRAWINGS

FIGS. 16(a) to 16(c) are sectional views of a substrate circuit in which connection terminals are provided at prescribed positions in a rigid printed wiring board by prior art.

DETAILED DESCRIPTION OF THE INVENTION

Figure 1A:
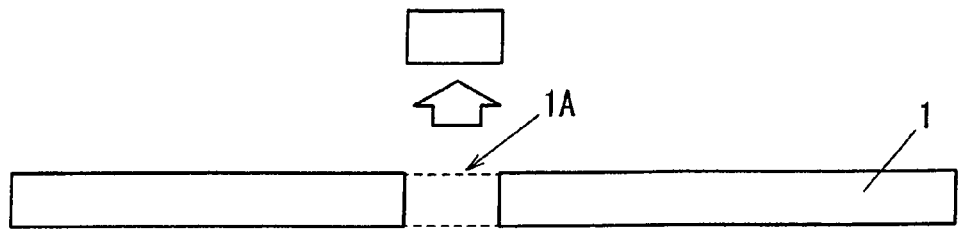
FIGS. 1(a) to 1(d) are sectional views which explain a method of manufacturing a laminate.

A bending rigid printed wiring board and a method of manufacturing the bending rigid printed wiring board in embodiments of the present invention will be described with reference to FIG. 1 to FIGS. 15(a) to 15(c).

The bending rigid printed wiring board 10 of this embodiment is such that in a bending rigid printed wiring board 10 in which an arbitrary circuit 14 is formed by etching a laminate 6 which is obtained by laminating a conductor layer 4 each on the front surface and rear surface of a hard base material 5, a bent portion 10A which is obtained by partially reducing the thickness of the above-described hard base material 5 is formed.

In this embodiment, as shown in FIGS. 1(a) to 1(d) (sectional views) which illustrate the manufacturing process of a laminate, a hard core material 1 from which a portion corresponding to the bent portion has been removed is used and a heat resistant resin material 2 is buried in a relevant gap portion (the portion from which the hard core material has been removed) 1A. And a conductor layer 4 is laminated each on the front surface and rear surface of the hard core material 1, in which the heat resistant resin material 2 is buried in the gap portion 1A, via heat resistant resin layers 31, 32, and after that, hot pressing is performed, whereby the laminate 6 in which the conductor layer 4 is laminated each on both surfaces of the hard base material 5 is fabricated.

In the embodiment shown in FIGS. 1(a) to 1(d), a hard core material 1 formed from a glass epoxy resin is used. In the center part of the flat-pate-like hard core material 1 having a layer thickness of 0.4 mm, there is provided a gap portion 1A which is obtained by removing part of the core material in groove form, whereby the gap portion 1A was formed in a place corresponding to the bent portion (refer to FIG. 1(a)).

Figure 1B:
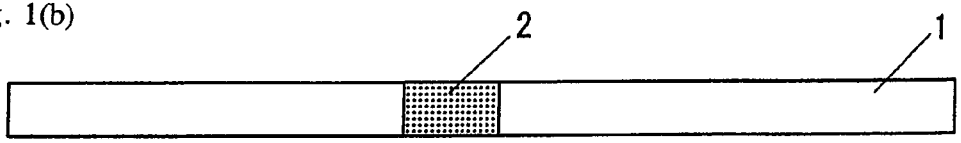

And a heat resistant resin material 2, such as a Teflon (registered trademark) sheet having a film thickness of 0.4 mm and silicone rubber, is buried in the above-described gap portion 1A, whereby the hard core material 1 in which the heat resistant resin material 2 is buried at a position corresponding to the bent portion is fabricated (refer to FIG. 1(b)).

By forming the gap portion 1A beforehand in part of the hard core material, it is possible to easily reduce part of the thickness of the hard base material by removing, in a succeeding step, the heat resistant resin material 2 buried in this gap portion 1A.

Also, by burying the heat resistant resin material 2 in the gap portion 1A of the hard core material 1, it is possible to make the pressure during hot pressing uniform in a succeeding step (during the fabrication of the laminate 6 by laminating the conductor layer 4).

Figure 1C:
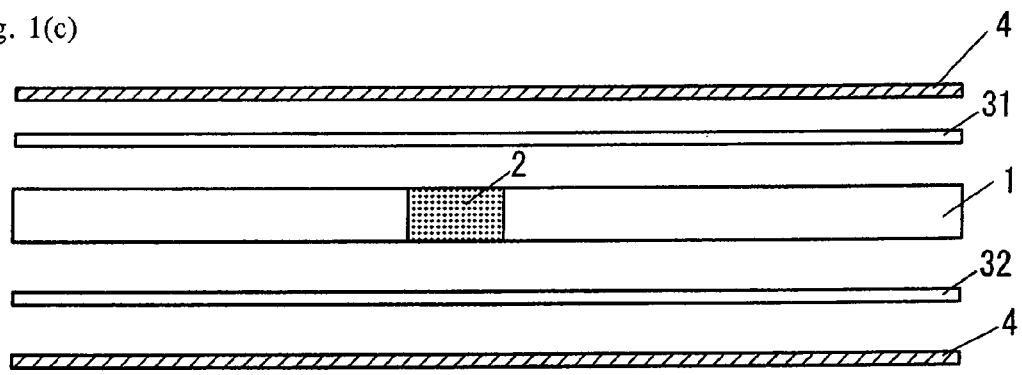
Figure 1D:
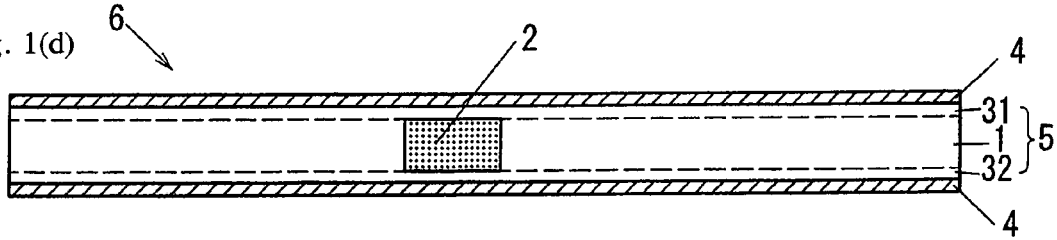

After the burying of the heat resistant resin material 2 in the gap portion 1A, a copper layer 4 having a film thickness of 200 μm to 600 μm is laminated (refer to FIG. 1(c)) each on the front surface and rear surface of the above-described hard core material 1 via heat resistant resin layers 31, 32 having a film thickness of 0.1 mm (corresponding to adhesive layers for bonding the copper layer 4) and hot pressing is performed, whereby the laminate 6 in which the copper layer 4 is bonded to both surfaces of the hard base material 5 is fabricated (refer to FIG. 1(d)).

In this embodiment, a bonding sheet 31 having a layer thickness of 0.1 mm and a glass epoxy resin sheet (a prepreg) 32 having a layer thickness of 0.1 mm were used as the heat resistant resin layers 31, 32.

And the copper layer 4 was laminated on the front surface of the hard core material 1 in which the heat resistant resin material 2 is buried in the gap portion 1A via the bonding sheet 31 and, at the same time, the copper layer 4 was laminated on the rear surface of the hard core material 1 via the glass epoxy resin sheet (the prepreg) 32 and hot pressed, whereby the laminate 6 in which the copper layer 4 is bonded to both surfaces of the hard base material 5 was fabricated.

Incidentally, it is also possible to fabricate a laminate obtained by laminating the copper layer 4 on both surfaces of the hard core material 1 via a bonding sheet or a laminate obtained by laminating the copper layer 4 on both surfaces of the hard core material 1 via a glass epoxy resin sheet (a prepreg).

When hot pressing is performed, the heat resistant resin layers 31, 32 (bonding sheets or glass epoxy resin sheets (prepregs)) cure thermally and the heat resistant resin layers 31, 32 become bonded to (become integral with) the hard core material 1, whereby the hard base material 5 having a layer thickness of 0.6 mm is formed and, at the same time, the copper layer 4 becomes bonded via the heat resistant resin layers 31, 32, with the result that it is possible to obtain the laminate 6 in which the copper layer 4 is bonded to both surfaces of the hard base material 5.

Incidentally, when a glass epoxy resin sheet (a prepreg) is laminated on the hard core material 1 formed from a glass epoxy resin and hot pressing is performed, the hard core material 1 and the glass epoxy resin sheet (the prepreg) become integral with each other.

Figure 2A:
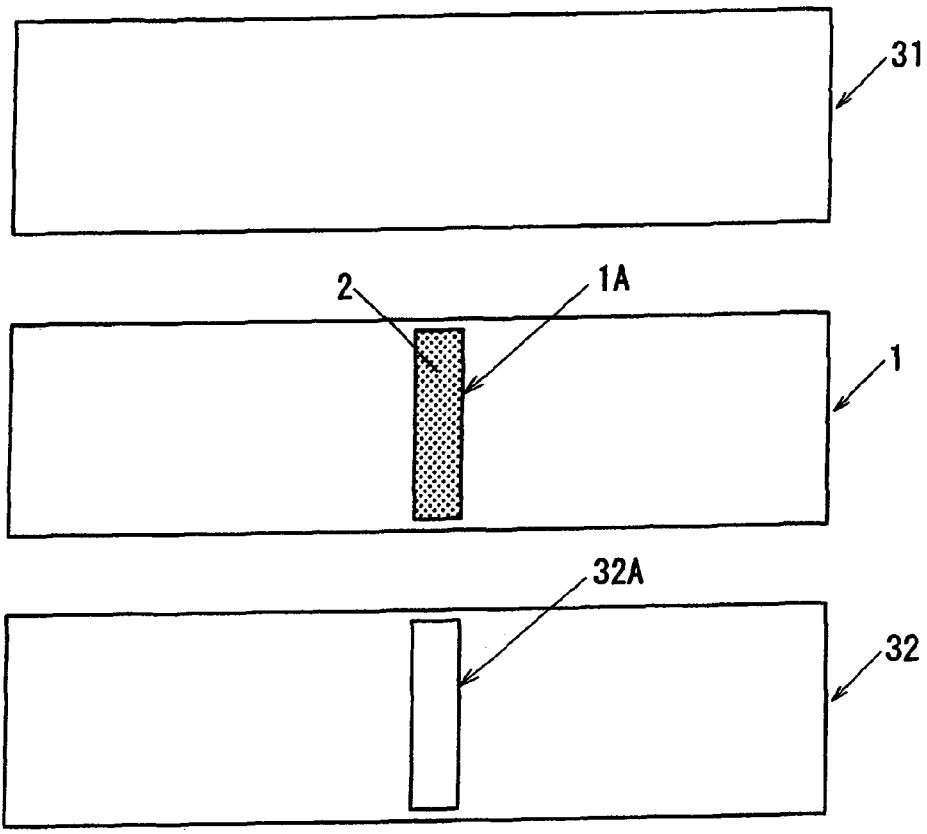
FIGS. 2(a) to 2(c) are plan views which show a heat resistant resin material buried in a gap portion.
Figure 2B:
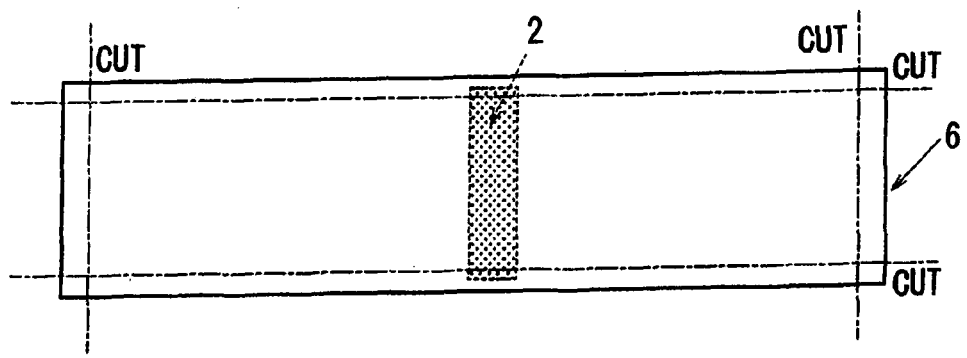
Figure 2C:
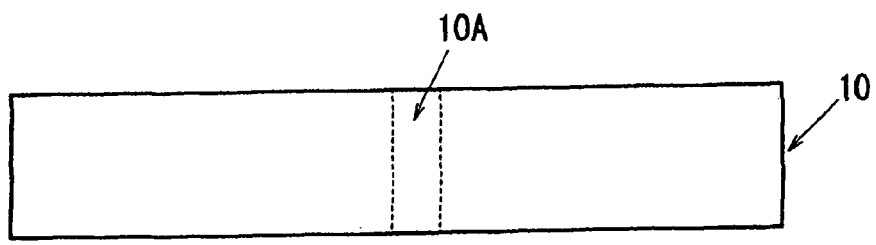

Furthermore, in this embodiment, as shown in the plan views of FIGS. 2(a) to 2(c), by burying the heat resistant resin material 2 beforehand in the gap portion 1A formed in the hard core material 1, it is possible to keep the shape of the gap portion 1A during hot pressing. Also, the pressure during hot pressing become equal and the laminate 6 can be fabricated without the formation of a recess in the gap portion 1A.

As shown in FIG. 2(a), the gap portion 1A which is obtained by removing part of the core material 1 in groove form was provided in the middle part of the hard core material 1, the heat resistant resin material 2 was buried in this gap portion 1A, and the heat resistant resin layers 31, 32 were laminated on the front surface and rear surface of the hard core material.

Incidentally, in the embodiment shown in FIG. 2(a), the groove-shaped gap portion 1A was formed by removing part of the core material 1, the heat resistant resin material 2 was buried in this gap portion 1A, and the heat resistant resin layers 31, 32 were laminated on the front surface and rear surface of the core material. However, it is also possible to use multiple hard core materials 1 and to arrange the core materials at specified intervals so as to form core materials 1 having a gap portion 1A.

It is also possible to laminate a heat resistant resin layer 32', in which a notch 32A similar to the above-described gap portion 1A is made, on the rear surface of the core material 1 in which the heat resistant resin material 2 is buried in the gap portion 1A and to laminate the copper layer 4 via the heat resistant resin 32' (refer to FIGS. 4(a) to 4(d)).

By laminating the copper layer 4 on both surfaces of the hard core material 1, in which the heat resistant resin material 2 is buried in the gap portion 1A, via the above-described heat resistant resin layers 31, 32, and performing hot pressing, it is possible to fabricate the laminate 6 which is obtained by bonding the copper layer 4 to the hard base material 5, with the shape of the gap portion 1A formed in the hard core material 1 kept and without the formation of a recess in the above-described gap portion 1A.

And in this embodiment, after the formation of the circuit 14 and a through hole 7 (a via through hole 7a and a mounting through hole 7b) in the above-described laminate 6, the edge portions of the laminate 6 were cut (refer to FIG. 2(b)) and the heat resistant resin material 2 buried in the gap portion 1A was removed, whereby the bending rigid printed wiring board 10 in which the bent portion 10A is arranged so as to traverse the middle of the substrate was obtained (refer to FIG. 2(c)). Incidentally, before the cutting of the edge portions, the heat resistant resin material 2 may be removed from the gap portion 1A.

According to this embodiment, as shown in FIGS. 3(a) to 3(d), which illustrate the manufacturing process of a rigid printed wiring board, arbitrary circuits 14 are formed on the front surface and rear surface of the hard base material 5 by etching the laminate 6 and the through hole 7 (the via through hole 7a which ensures the conducting properties of the circuits formed on the front surface and rear surface of the substrate and the mounting through hole 7b for providing the connection terminals at prescribed positions) is formed.

And after that, the heat resistant resin material 2 buried in the gap portion 1A of the hard core material 1 is removed along with the heat resistant resin layer 32 laminated on the rear surface of the heat resistant resin material 2, whereby the bent portion 10A obtained by reducing the thickness of the hard base material 5 in part is formed.

Figure 3A:
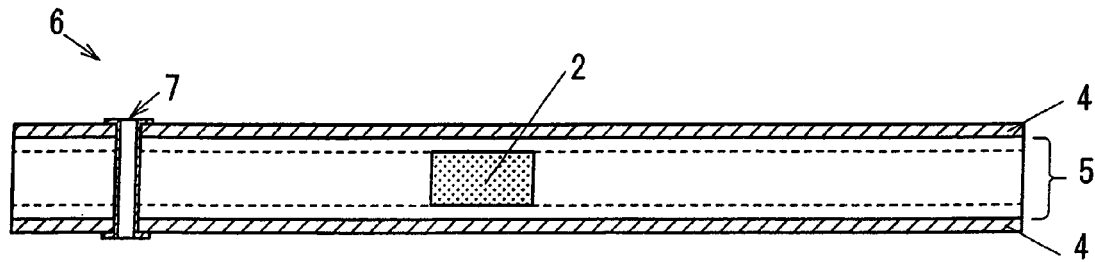
FIGS. 3(a) to 3(d) are sectional views which explain a method of manufacturing a bending rigid printed wiring board according to the present invention.
Figure 3B:
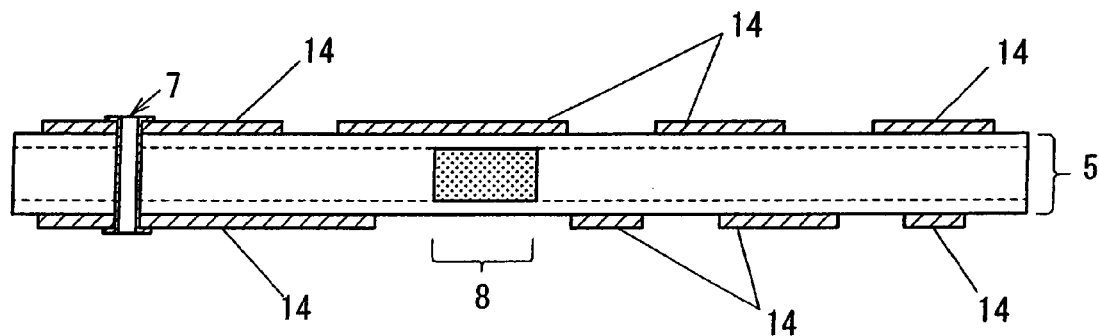
Figure 3C:
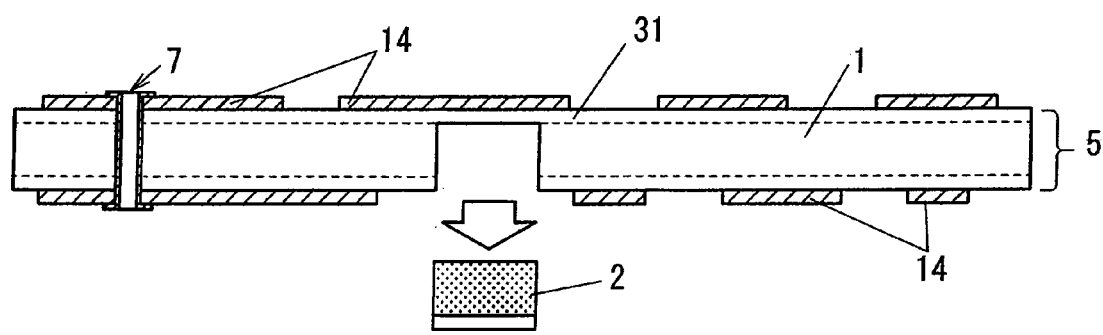

In the embodiment shown in FIGS. 3(a) to 3(d), a hole was made at a necessary position of the laminate 6 obtained by bonding the copper layer 4 on both surfaces of the hard base material 5 and this holed place (a through hole of the substrate) was plated, whereby the through hole 7 (the via through hole 7a which ensures the conducting properties of the copper layers 4 formed on both surfaces of the hard base material and the mounting through hole 7b for providing the connection terminals at prescribed positions) was formed (refer to FIG. 3(a)) and the above-described laminate 6 was etched, whereby the arbitrary circuits 14 were formed on both surfaces of the above-described hard base material 5 (refer to FIG. 3(b)).

Incidentally, in etching the laminate 6 and forming the arbitrary circuits 14 on the rear surface of the hard base material 5, the copper layer 4 at a position corresponding to the gap portion 1A of the hard core material 1 (on the rear surface of the heat resistant resin material 2) is removed by etching beforehand (an exposed portion 8).

Figure 3D:
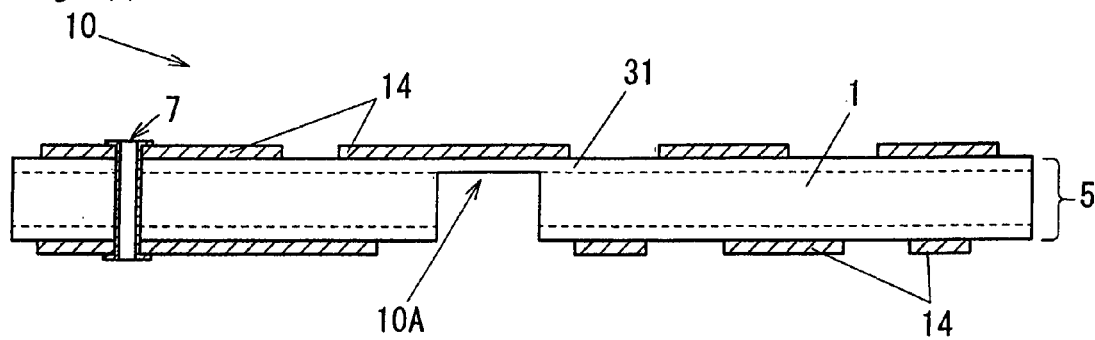

And the heat resistant resin layer 32 was cut in the above-described exposed portion 8 and removed along with the heat resistant resin material 2 buried in the gap portion 1A, whereby the bent portion 10A obtained by partially reducing the thickness of the hard base material 5 was formed (refer to FIG. 3(d)).

That is, by removing the heat resistant resin material 2 buried in the gap portion 1A along with the heat resistant resin layer 32 on the rear surface, a thin-walled portion consisting of the heat resistant resin layer 31 (bonding sheet) having a film thickness of 0.1 mm, which is a single layer, is formed in part of the hard base material 5 and the rigid printed wiring board can be bent in this thin-walled portion (the bent portion 10A).

In the bending rigid printed wiring board 10 in this embodiment, on the front surface of the thin-walled portion consisting of the heat resistant resin layer 3 (the bonding sheet 31), which is a single layer, there is formed the circuit 14 made by etching the copper layer 4 having a layer thickness of 200 μm to 600 μm and it is ensured that circuits formed on the front surface of the hard base material 5 are connected together, the hard base material being arranged right and left, with the bent portion 10A interposed.

Next, with reference to FIGS. 4(a) to 4(d), a description will be given of a method of manufacturing a bending rigid printed wiring board 10 which involves laminating a conductor layer 4 on the front surface of a hard core material 1 in which a heat resistant resin material 2 is buried in a gap portion 1A via a heat resistant resin layer 31, at the same time laminating a conductor layer 4 on the rear surface of the hard core material 1 via a heat resistant resin layer 32' in which a notch 32A similar to the above-described gap portion 1A is made, performing hot pressing, whereby a laminate 61 in which the conductor layers 4 are bonded to both surfaces of the hard base material 51 is fabricated, and removing the heat resistant resin material 2 buried in the gap portion 1A from this laminate 61.

In the embodiment shown in FIGS. 4(a) to 4(d), in the same way as with the embodiment shown in FIGS. 1(a) to 1(d), in the center part of the flat-plate-like hard core material 1 which is made of a glass epoxy resin and has a layer thickness of 0.4 mm, there is provided the gap portion 1A which is formed by removing part of the core material in groove form.

And in this embodiment, a heat resistant resin material 2, such as a Teflon (registered trademark) sheet having a film thickness of 0.5 mm and silicone rubber, was buried in the gap portion 1A of the hard core material 1, and a convex portion having a height of 0.1 mm was formed, the convex portion being such that the heat resistant resin material 2 protrudes from the rear surface of the gap portion 1A. Also, the notch 32A corresponding to the above-described convex portion was formed in the heat resistant resin layer 32' laminated on the rear surface of the hard core material 1, and the copper layer 4 having a layer thickness of 200 to 600 μm was laminated each on the front surface and rear surface of the hard core material 1, in which the heat resistant resin material 2 is buried in the gap portion 1A, via the heat resistant resin layers 31, 32' (refer to FIG. 4(a)).

When the copper layer 4 is laminated, via the heat resistant resin layer 31, on the front surface of the hard core material 1, in which the heat resistant resin material 2 is buried in the gap portion 1A, the copper layer 4 is laminated on the rear surface via the heat resistant resin layer 32' in which the notch 32A is made, and hot pressing is performed, the above-described heat resistant resin layers 31, 32' cure thermally and become bonded to (become integral with) the hard core material 1 and the hard base material 51 having a layer thickness of 0.6 mm is formed and, at the same time, the copper layer 4 becomes bonded via the above-described heat resistant resin layers 31, 32', whereby it is possible to obtain the laminate 61 in which the copper layer 4 is laminated on both surfaces of the hard base material 51. (Refer to FIG. 4(b).)

Incidentally, in this example, the copper layer 4 is laminated on the rear surface of the heat resistant resin material 2 buried in the gap portion 1A without the interposition of the heat resistant resin layer 32'.

After that, arbitrary circuits 14 are formed on the front surface and rear surface of the hard base material 51 by etching the laminate 61 and at the same time, a through hole 7 (a via through hole 7a which ensures the conducting properties of the circuits formed on the front surface and rear surface of the substrate and a mounting through hole 7b for providing connection terminals at prescribed positions) is formed. (Refer to FIG. 4(c).)

Incidentally, in etching the laminate 61 and forming the arbitrary circuits 14 on the rear surface of the hard base material 5, the copper layer 4 on the rear surface of the heat resistant resin material 2 buried in the gap portion 1A is removed by etching beforehand (an exposed portion 8).

Figure 4A:
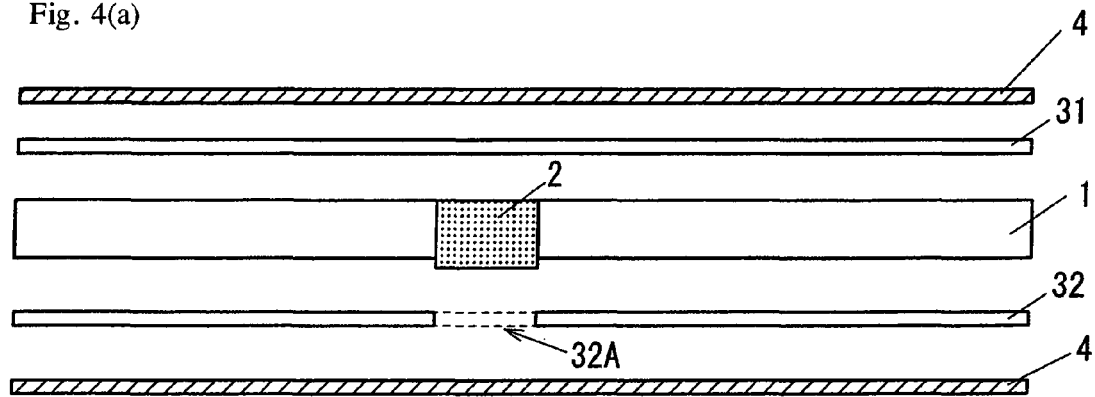
FIGS. 4(a) to 4(d) are sectional views which explain a method of manufacturing a bending rigid printed wiring board in another embodiment.
Figure 4B:
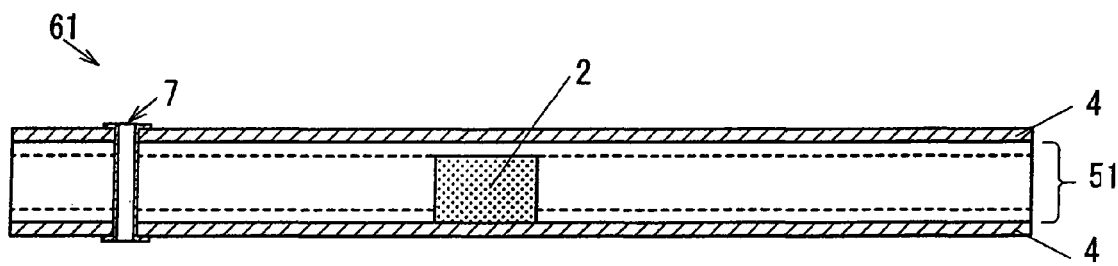
Figure 4C:
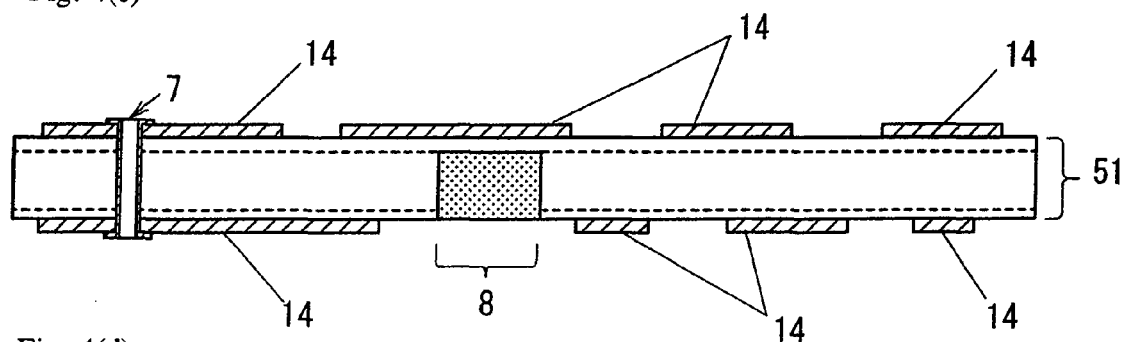
Figure 4D:
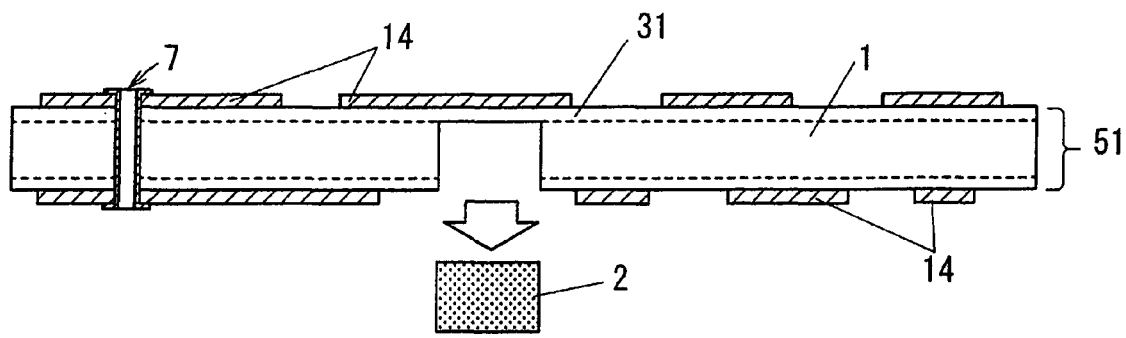

And in this embodiment, as shown in FIG. 4(d), by removing the heat resistant resin material 2 buried in the gap portion 1A of the hard core material 1, a bent portion 10A which is obtained by reducing the thickness of part of the hard base material 51 is formed.

In a both-side wiring board in which the circuits 14 are formed on the front surface and rear surface of the hard base material 51, a bending rigid printed wiring board 10 provided with a bent portion 10A which is obtained by partially reducing the thickness of the hard base material 51 has been described above. However, the bending rigid printed wiring board is not limited to the both-side wiring board.

Figure 5A:
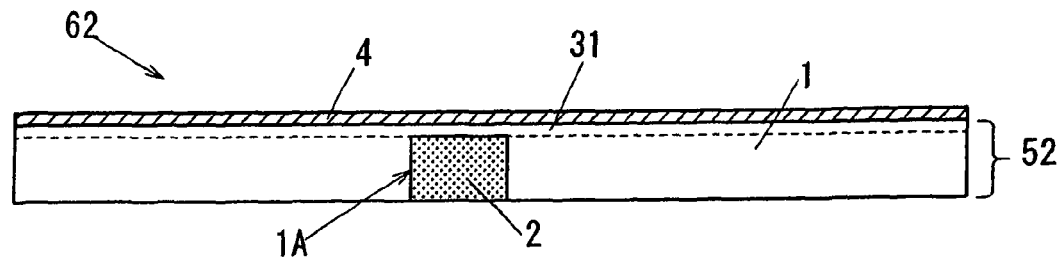
FIGS. 5(a) to 5(c) are sectional views which explain a method of manufacturing a bending rigid printed wiring board (a single-side wiring board)
Figure 5B:
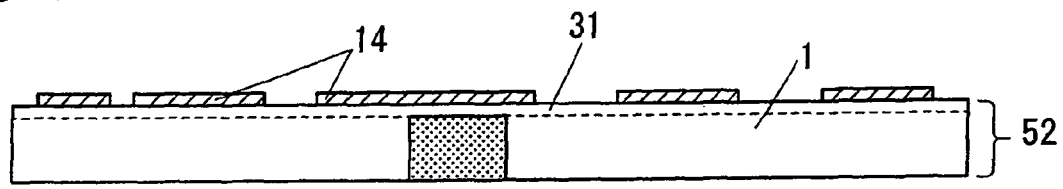
Figure 5C:
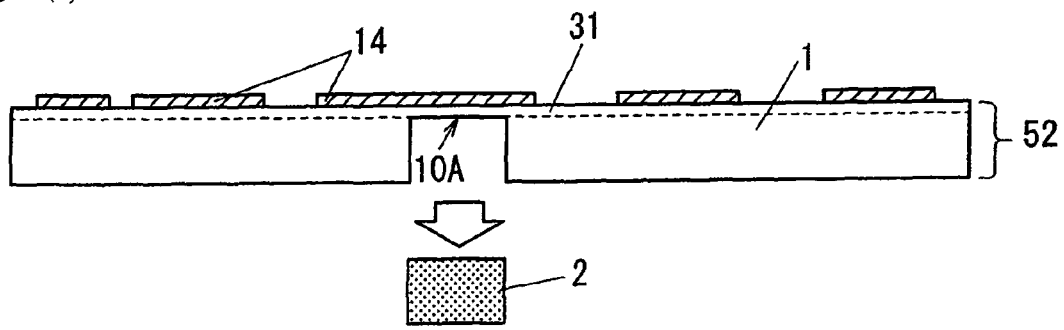

For example, as shown in FIGS. 5(a) to 5(c), a laminate 62 which is obtained by laminating, via a heat resistant resin layer 3, a conductor layer 4 on the front surface (a single side) of a hard core material 1, in which a heat resistant resin material 2 is buried in a gap portion 1A, is used (refer to FIG. 5(a)), and, by etching the laminate, circuits 14 are formed on the front surface of the hard base material 52 constituted by the hard core material 1 and the heat resistant resin layer 3 (refer to FIG. 5(b)). At the same time, the heat resistant resin material 2 buried in the gap portion 1A of the hard core material 1 is removed and a thin-walled portion constituted by only a heat resistant resin layer 3, which is a single layer, is provided in part of the hard base material 52, whereby it is possible to obtain a bending rigid printed wiring board (a single-side wiring board) having a bent portion 10A formed by partially reducing the thickness of the hard base material 52 (refer to FIG. 5(c)).

Also, for example, as shown in FIGS. 6(a) to 6(e), by using a core material 11 in the form of a shielded plate, it is possible to obtain a bending rigid printed wiring board (a multilayer wiring board) having a bent portion 10A obtained by partially reducing the thickness.

Figure 6A:
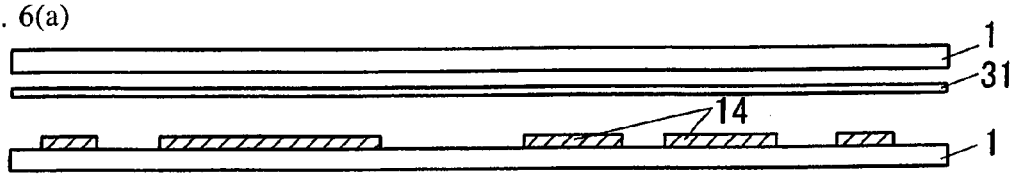
FIGS. 6(a) to 6(e) are sectional views which explain a method of manufacturing a bending rigid printed wiring board (a multilayer wiring board)
Figure 6B:
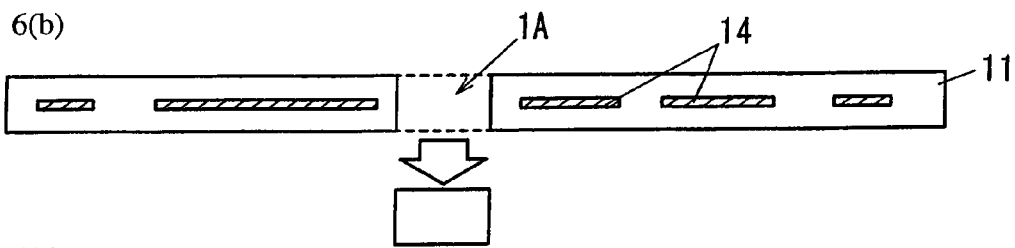
Figure 6C:
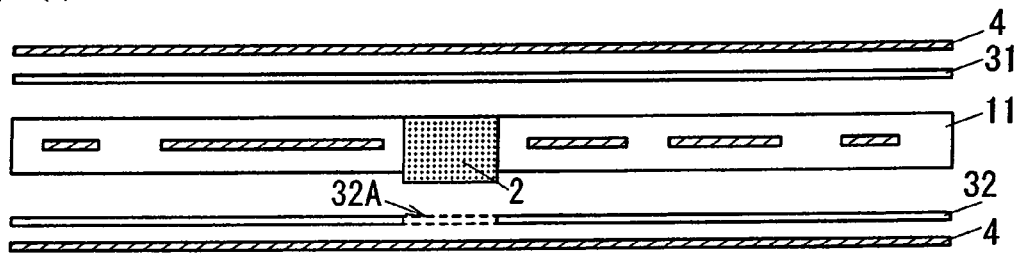
Figure 6D:
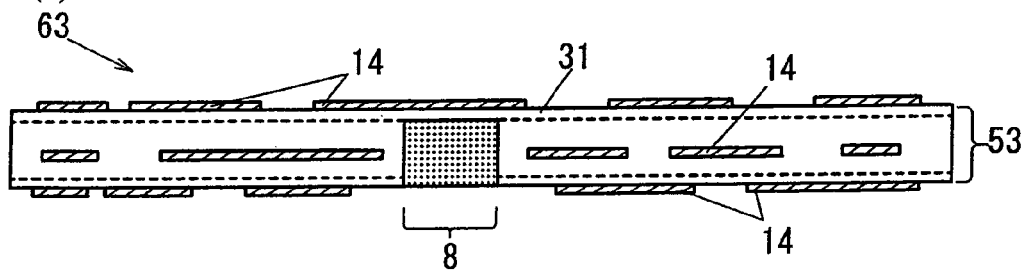
Figure 6E:
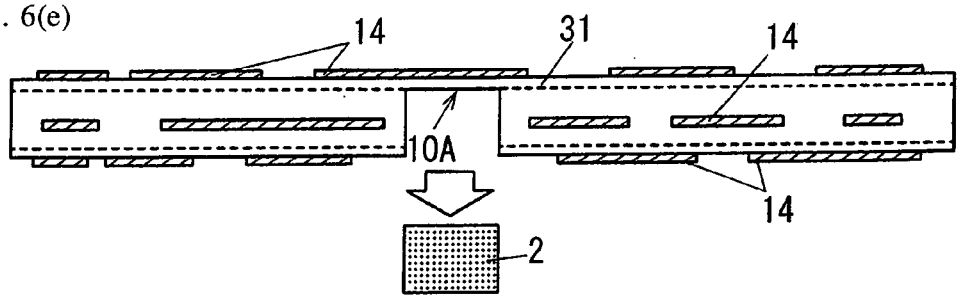

As shown in FIGS. 6(a) to 6(d), a hard core material 1 is laminated, via a heat resistant resin layer 31, on the front surface of a rigid wiring board in which circuits 14 are formed on the front surface of a hard core material 1 and hot pressing is performed, whereby a hard core material 11 in the form of a shielded plate is fabricated (refer to FIG. 6(a)), a gap portion 1A is formed by removing part of the hard core material 11 in the form of a shielded plate (refer to FIG. 6(b)), a conductor layer 4 is laminated, via a heat resistant resin layer 31, on the front surface of the core material 11 in the form of a shielded plate in which a heat resistant resin material 2 is buried in the above-described gap portion 1A, a conductor layer 4 is laminated on the rear surface via a heat resistant resin layer 32' in which a notch 32A is made, and hot pressing is performed, whereby a laminate 63 in which the conductor layers 4 are laminated on both surfaces of a hard base material 53 is fabricated (refer to FIG. 6(c)). And the circuits 14 are formed on the front surface and rear surface of the hard base material 53 by etching the above-described laminate 63 and at the same time, the conductor layer 4 on the rear surface of the gap portion 1a is removed by etching (refer to FIG. 6(d)) and furthermore, the heat resistant resin material 2 buried in the above-described gap portion 1A is removed, whereby it is possible to obtain a multilayer wiring board having a bent portion 10A which is formed by partially reducing the thickness (refer to FIG. 6(e)).

Next, with reference to FIGS. 7(a) to 7(d) to FIGS. 12(a) and 12(b), a description will be given of a method of manufacturing a bending rigid printed wiring board in which a circuit for large current and a circuit for small current are formed on the same substrate by forming conductor parts (4A, 4B) having different layer thicknesses on the same surface of a conductor layer 4.

FIGS. 7(a) to 7(d) are diagrams to explain a method of forming conductor layer 4 which is constituted by a thick conductor portion 4A having a thickness of not less than 175 μm, preferably 200 to 600 μm, and a thin conductor portion 4B having a thickness of not more than 105 μm, preferably 18 to 70 μm. In this embodiment, a conductor plate 40 having a thickness of not less than 175 μm, preferably 200 to 600 μm and a conductor laminate material 44 which is formed to suit the shape of the above-described hole portion and the thickness of the conductor plate (a conductor laminate material 44 formed by laminating a thin conductor 43) are used.

Figure 7A:
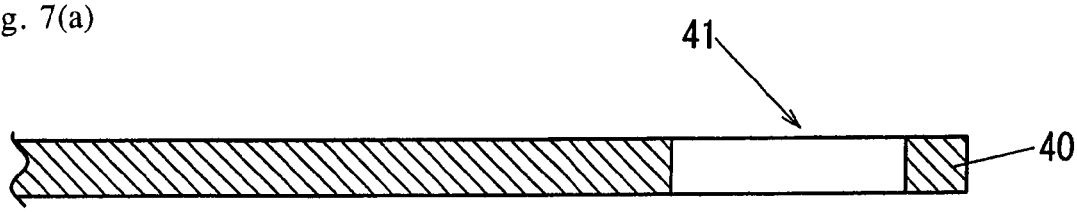
FIGS. 7(a) to 7(d) are partial sectional views which explain a method of manufacturing a bending rigid printed wiring board provided with conductor portions having different layer thicknesses on the same surface.

First, as shown in FIG. 7(a), the conductor plate 40 having a thickness of not less than 175 μm, preferably 200 to 600 μm is prepared, and a hole portion 41 is formed in this conductor plate 40.

Figure 7B:
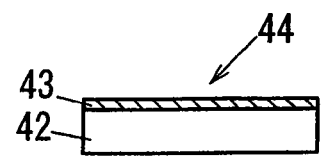

As shown in FIG. 7(b), the conductor laminate material 44, which is obtained by laminating a thin conductor 43 (a conductor 43 having a thickness of not more than 100 μm, preferably 18 to 70 μm) on an insulating base material 42, is formed to suit the thickness of the above-described conductor plate 40 and the shape of the hole portion 41.

Figure 7C:
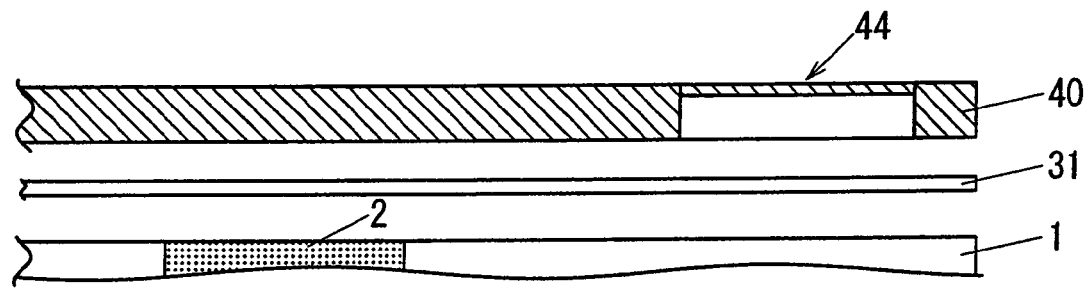
Figure 7D:
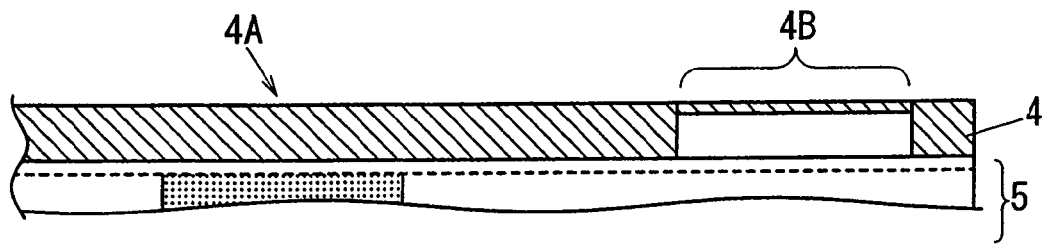

And as shown in FIG. 7(c), the conductor laminate material 44 obtained by laminating the thin conductor 43 is buried (embedded) in the hole portion 41 of the conductor plate 40. And the conductor plate 40, in which the conductor laminate material 44 is buried in the hole portion 41, is laminated on a core material 1 via a heat resistant resin layer (31 or 32) and hot pressing is performed, whereby as shown in FIG. 7(d), the conductor portions having different layer thicknesses 4A and 4B are formed on the same surface of the conductor layer 4. That is, upon the same surface of the conductor layer 4, there are formed the thick conductor portion 4A having a thickness of not less than 175 μm, preferably 200 to 600 μm, and the thin conductor portion 4B having a thickness of not more than 105 μm, preferably 18 to 70 μm. Incidentally, in a bent portion 10A of a bending rigid printed wiring board, the conductor plate 40 is laminated so that the thick conductor portion 4A having a thickness of not less than 175 μm can be provided.

Subsequently, with reference to FIGS. 8(a) to 8(c) to FIGS. 12(a) and 12(b), a description will be given of a method of manufacturing a bending rigid printed wiring board in which a circuit for large current and a circuit for small current are formed on the same surface.

In this embodiment, by using the technique shown in FIGS. 7(a) to 7(d), a bending rigid printed wiring board 10 is manufactured, in which a circuit for large current 14a having a thickness of not less than 175 μm, preferably 200 to 600 μm (for example, an inner circuit of an electric connection box) and a circuit for small current 14b having a thickness of not more than 105 μm, preferably 18 to 70 μm (for example, an electronic circuit) are formed.

Figure 8A:
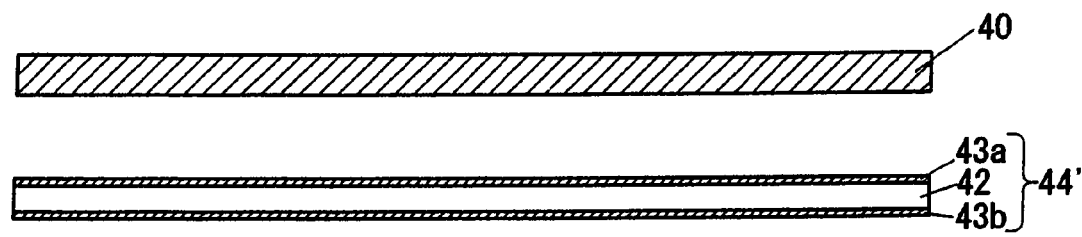
FIGS. 8(a) to 8(c) are first explanatory diagrams of a method of manufacturing a bending rigid printed wiring board in which a circuit for large current and a circuit for small current are formed on the same surface.

In this embodiment, as shown in FIG. 8(a), there are prepared a conductor plate 40 having a thickness of not less than 200 μm and a conductor laminate parent material 44' having the same thickness as this conductor plate. Incidentally, a conductor laminate parent material obtained by laminating thin conductors 43a, 43b having a thickness of 18 to 70 μm on the front surface and rear surface of an insulating base material 42 was used as the conductor laminate parent material 44'.

Figure 8B:
Figure 8C:
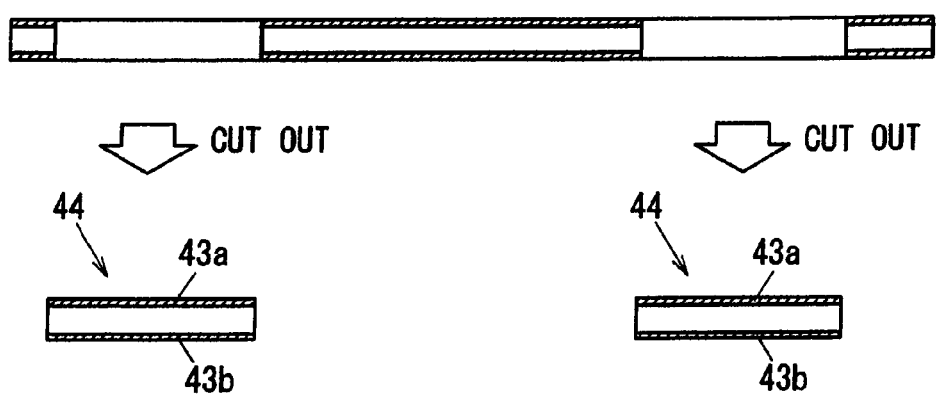

And as shown in FIG. 8(b), a hole portion 41 is formed by partially boring the conductor plate 40 and at the same time, as shown in FIG. 8(c), a conductor laminate 44 is cut out of the conductor laminate parent material 44' to suit the shape of a hole portion 41 of the above-described conductor plate 40.

In this embodiment, two hole portions 41 were made each in two conductor plates 40 and four conductor laminate materials 44 were cut out of one conductor laminate parent material 44' to suit the shape of the hole portion 41.

Figure 9A:
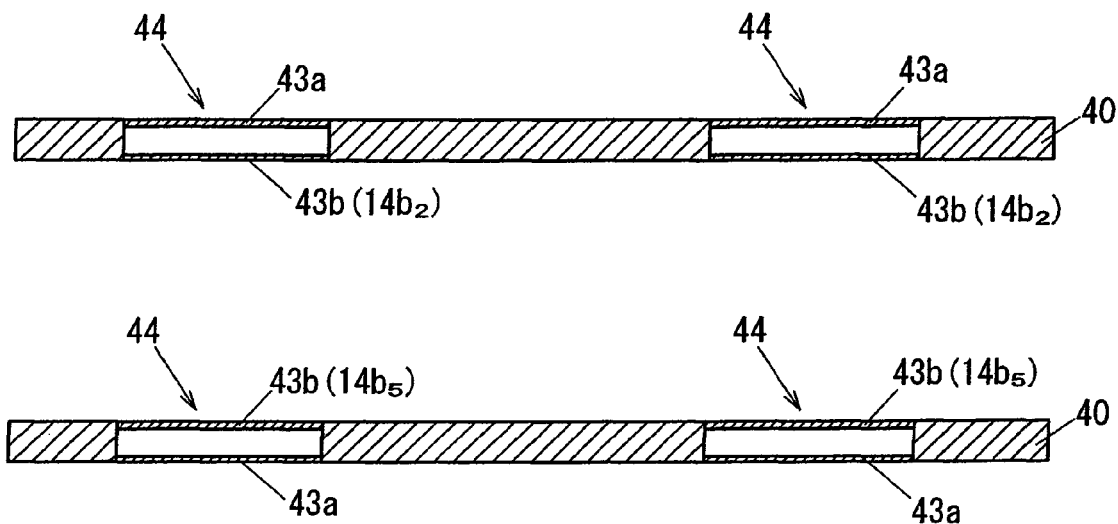
FIGS. 9(a) and 9(b) are second explanatory diagrams of a method of manufacturing a bending rigid printed wiring board in which a circuit for large current and a circuit for small current are formed on the same surface.
Figure 9B:
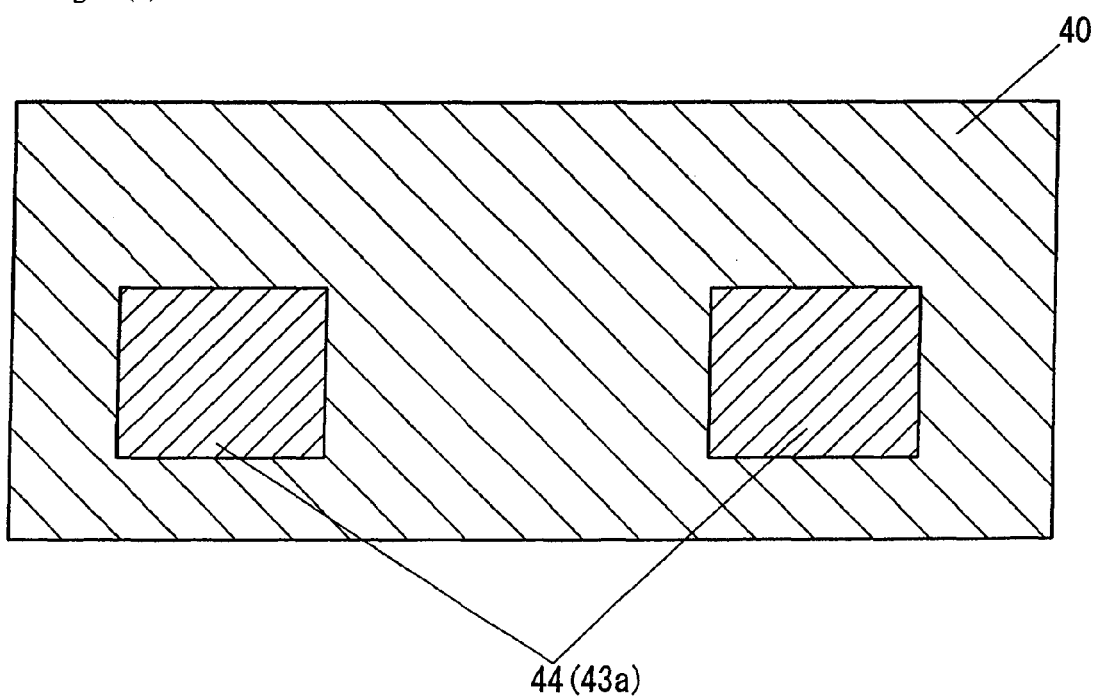

And as shown in the sectional view of FIG. 9(*a*), the conductor laminates 44, in which the thin conductors 43*a*, 43*b* are laminated on the front surface and the rear surface, were buried (embedded) in their respective hole portions 41, and as shown in the plan view of FIG. 9(*b*), the thin conductors 43*a*, 43*b* having a thickness of 18 to 70 μm were partially formed on the same surface of the conductor plate 40 having a thickness of not less than 200 μm. Incidentally because the conductor plate 40 and the conductor laminate material 44 have the same thickness, the front surface of the conductor and the thin conductors 43*a*, 43*b* obtain the same height.

In this embodiment, the thin conductor 43*b* on one side of the above-described conductor laminate material 44 was etched, circuits for small current (14*b*$_2$, 14*b*$_5$) were formed beforehand, and the conductor laminate materials 44 were buried in the hole portions 41 of the conductor plates 40 so that these circuits for small current (14*b*$_2$, 14*b*$_5$) are arranged on the inner side. That is, it was ensured that the circuits for small current (14*b*$_2$, 14*b*$_5$) are formed on a thin conductor 43*b* which are arranged on the inner side when the conductor plates 40, in which the conductor laminate material 44 is buried, are each laminated on the front surface and rear surface of the hard core material via heat resistant resin layers 31, 32, are formed beforehand.

Figure 10A:
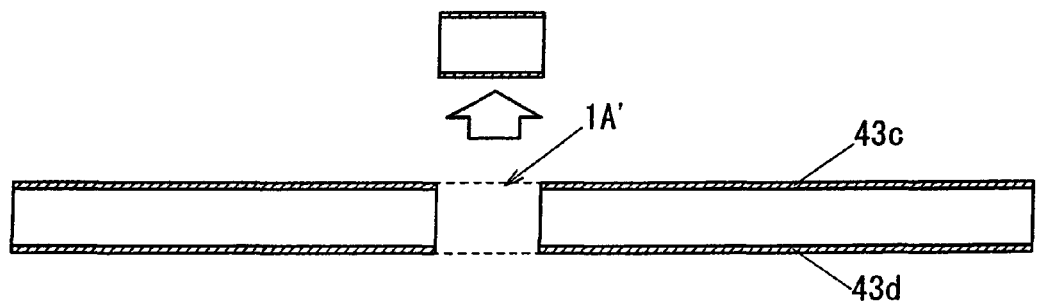
FIGS. 10(a) and 10(b) are third explanatory diagrams of a method of manufacturing a bending rigid printed wiring board in which a circuit for large current and a circuit for small current are formed on the same surface.
Figure 10B:
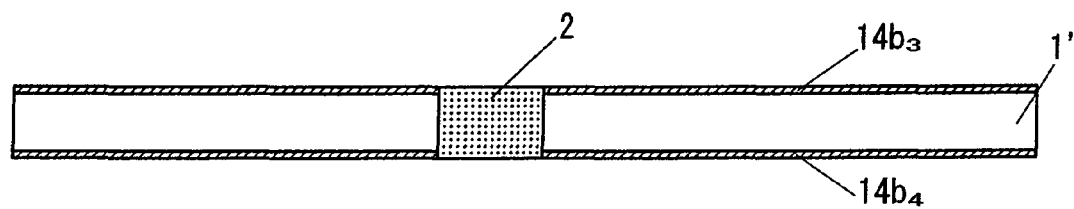
Figure 11A:
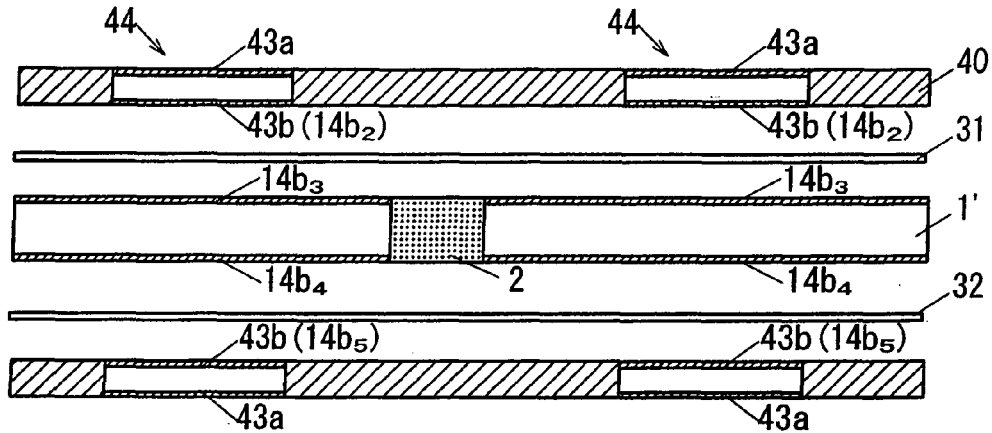
FIGS. 11(a) to 11(d) are fourth explanatory diagrams of a method of manufacturing a bending rigid printed wiring board in which a circuit for large current and a circuit for small current are formed on the same surface.
Figure 11B:
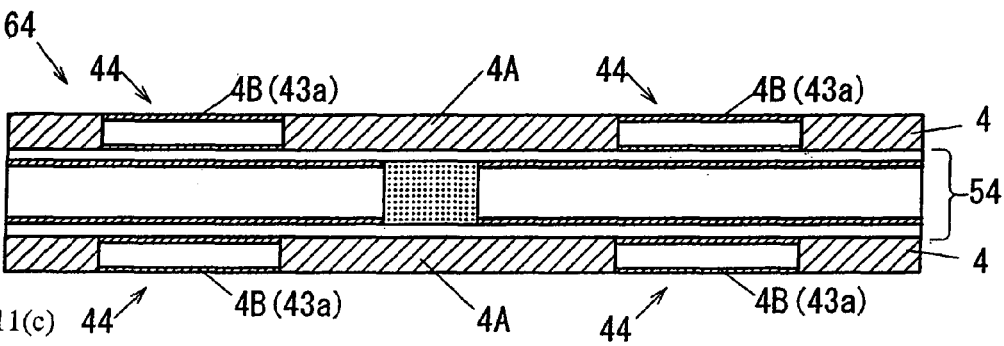
Figure 11C:
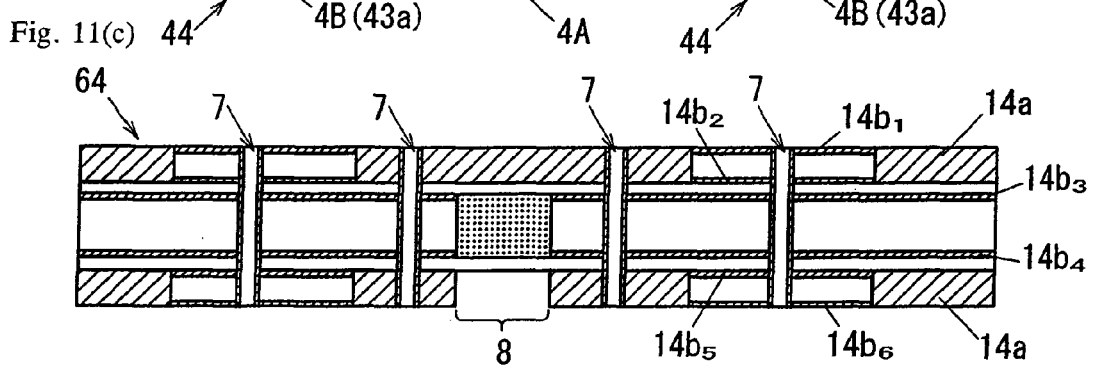
Figure 11D:
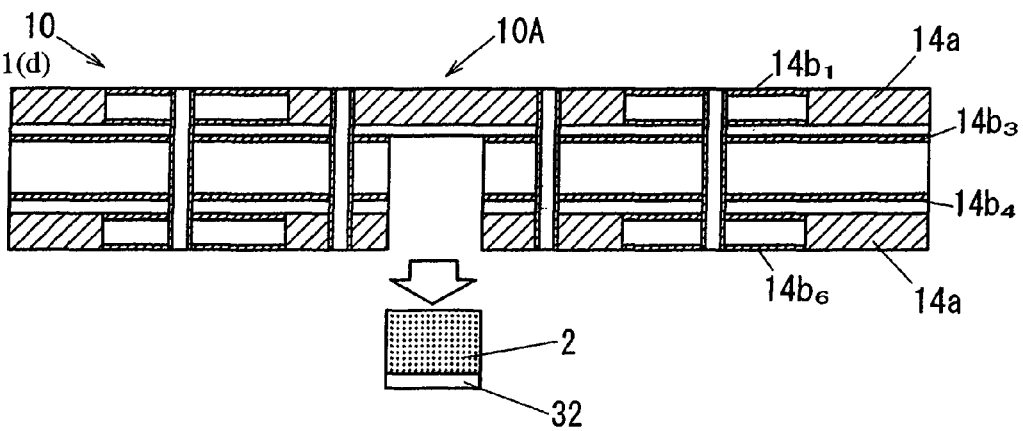
Figure 12A:
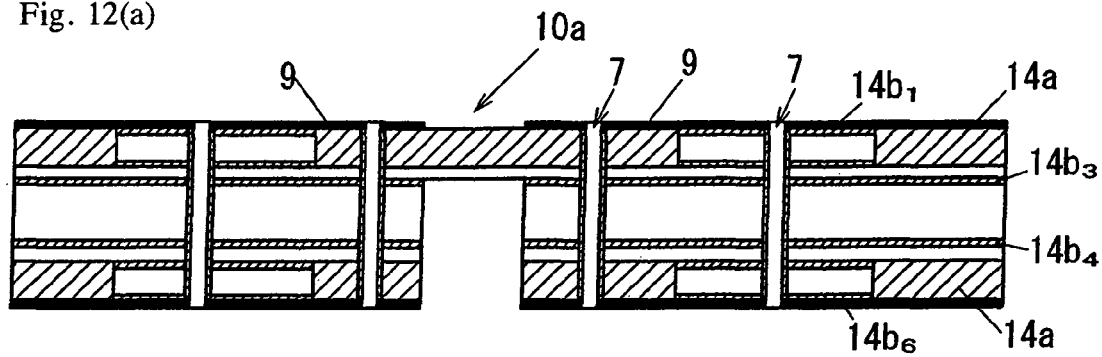
FIGS. 12(a) and 12(b) are fifth explanatory diagrams of a method of manufacturing a bending rigid printed wiring board in which a circuit for large current and a circuit for small current are formed on the same surface.
Figure 12B:
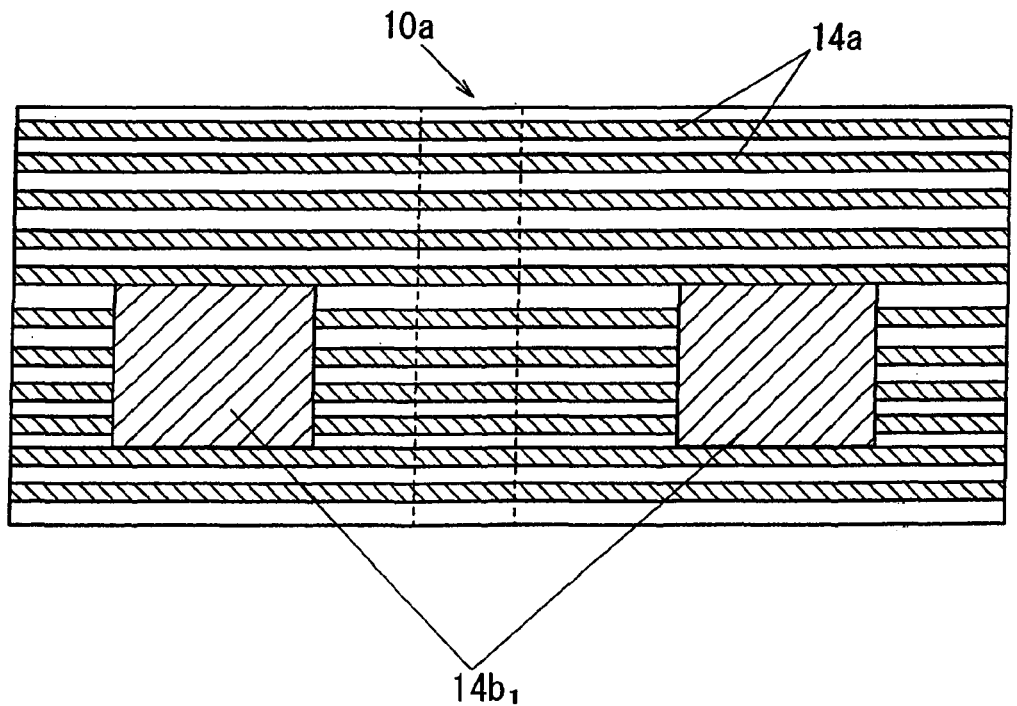

In the manufacturing process of a bending rigid printed wiring board, in this embodiment, a hard core material obtained by laminating thin conductors 43*c*, 43*d* on the front surface or rear surface of the core material was used as the hard core material obtained by removing a place corresponding to a bent portion (refer to FIG. 10(*a*)). And a heat resistant resin material 2 is buried in a gap portion (a portion from which the hard core material has been removed) 1A of the hard core material 1' on which the thin conductors 43*c*, 43*d* are laminated. Incidentally, circuits for small current (14*b*$_3$, 14*b*$_4$) were formed by etching the thin conductors 43*c*, 43*d* on the front surface or rear surface of the hard core material 1'.

And as shown in FIGS. 11(*a*) to 11(*d*), the conductor plates 40, in which the conductor laminate material 44 is buried in the hole portion 41, are laminated, via the heat resistant resin layers 31, 32, on the front surface and rear surface of the hard core material 1' in which the heat resistant resin material 2 is buried in the gap portion 1A and hot pressing is performed, whereby a laminate 64 is fabricated (refer to FIGS. 11(*a*) and 11(*b*)).

As shown in FIG. 11(*b*), a thick conductor portion 4A having a thickness of not less than 200 μm and a thin conductor portion 4B (a thin conductor 43*a*) having a thickness of 18 to 70 μm are formed on the conductor layers 4 on the front surface and rear surface of the laminate 64 fabricated by laminating the conductor plate 40, in which the conductor laminate material 44 is buried in the hole portion 41.

And as shown in FIG. 11(*c*), circuits for small current 14*b*$_1$, 14*b*$_6$ having a thickness of 18 to 70 μm were formed by etching the above-described thin conductor portion 4B (the thin conductor 43*a*) and at the same time, a circuit for large current 14*a* having a thickness of not less than 200 μm was formed by etching the above-described thick conductor portion 4A. Thus, the circuit for large current 14*a* and the circuits for small current 14*b*$_1$, 14*b*$_6$ were formed on the same surface. Also, through holes 7 (via through holes for ensuring the conducting properties of circuits formed on the front surface and rear surface of the substrate and mounting through holes for providing connection terminals at prescribed positions) were formed in the laminate 64.

Incidentally, in forming the arbitrary circuit (the circuit for large current) 14*a* by etching the thick conductor portion 4A of the conductor 4 having a thickness of not less than 200 μm, the conductor layer 4 of a place corresponding to the gap portion 1A of the hard core material 1' (on the rear surface of the heat resistant resin material 2) is removed beforehand (an exposed portion 8). And as shown in FIG. 11(*d*), the heat resistant resin material 2 buried in the gap portion 1A of the hard core material 1' is removed along with the heat resistant resin layer 32 on the rear surface, whereby a bent portion 10A is formed.

FIGS. 12(*a*) and 12(*b*) are diagrams which show a bending rigid printed wiring board in which a circuit for large current and a circuit for small current are formed on the same surface, FIG. 12(*a*) being a sectional view and FIG. 12(*b*) being a plan view.

As shown in FIG. 12(*a*), in a bending rigid printed wiring board of this embodiment, a circuit for large current 14$_a$ having a thickness of not less than 200 μm and circuits for small current 14*b*$_1$, 14*b*$_6$ having a thickness of 18 to 70 μm are formed on the same surface, with the height of these circuits being flush with each other.

As shown in FIG. 12(*b*), the circuit for large current 14$_a$ and the circuits for small current 14*b*$_1$, 14*b*$_6$ are formed on the front surface (the outermost layer) of the bending rigid printed wiring board, and the electrically conducting properties of these circuits are ensured via through holes 7 and circuits formed on the inner side (circuits for small current 14*b*$_3$, 14*b*$_4$).

The electrically conducting properties of the circuits for small current (14*b*$_1$, 14*b*$_2$, 14*b*$_5$, 14*b*$_6$) formed by etching the thin conductors 43*a*, 43*b* of the conductor laminate material 44 buried in the hole portion 41 of the conductor plate 40 the circuit for large current 14*a* formed by etching the conductor plate 40 are ensured, as shown in FIG. 12(*a*), by the medium of a through hole 7 (a via through hole) provided in the section where the circuits for small current (14*b*$_1$, 14*b*$_2$, 14*b*$_5$, 14*b*$_6$) are formed, a through hole 7 (via through hole) provided in the section where the circuit for large current 14*a* is formed, and the circuits for small current (14*b*$_3$, 14*b*$_4$) provided on the front surface or rear surface of the core material 1'.

Incidentally, the front surface and rear surface of the bending rigid printed wiring board are coated with a resist (an insulating material) 9 in order to protect the circuits.

Next, with reference to FIGS. 13(*a*) to 13(*d*), a description will be given of a method of manufacturing a substrate board in which connection terminals 20 are provided at prescribed positions in a rigid printed wiring board.

In this embodiment, a bending rigid printed wiring board 10 having a bent portion 10A which is formed by partially reducing the thickness of a hard base material 5 was used, and after the installation of connection terminals 20 to the front surface of this bending rigid printed wiring board 10, the bending rigid printed wiring board 10 was bent at a bent portion 10A, whereby a substrate circuit in which the connection terminals 20 are provided at prescribed positions on both surfaces was manufactured.

In the bending rigid printed wiring board 10 of this embodiment, as shown in FIG. 13(*a*), circuits 14 are formed on the front surface and rear surface of the hard base material 5 and at the same time, via through holes 7*a* for ensuring the electrically conducting properties of the circuits formed on the above-described front surface and rear surface are formed. In the middle of the substrate, a bent portion 10A which is obtained by partially reducing the thickness of the hard base material 5 is formed and at the same time, in the substrate (the base material 5) arranged right and left with the bent portion 10A interposed, there are formed mounting through holes 7b for arranging the connection terminals 20 at prescribed positions.

Incidentally, the circuit 14 is formed on the front surface of the bent portion 10A which is obtained by partially reducing the thickness of the hard base material 5 and this ensures the connection of the circuits formed on the front surface of the substrate (the base material 5) arranged right and left with the bent portion 10A interposed.

Furthermore, in the rigid printed wiring board 10 of this embodiment, the circuit surfaces are coated with the resist (the insulating material) 9.

Figure 13A:
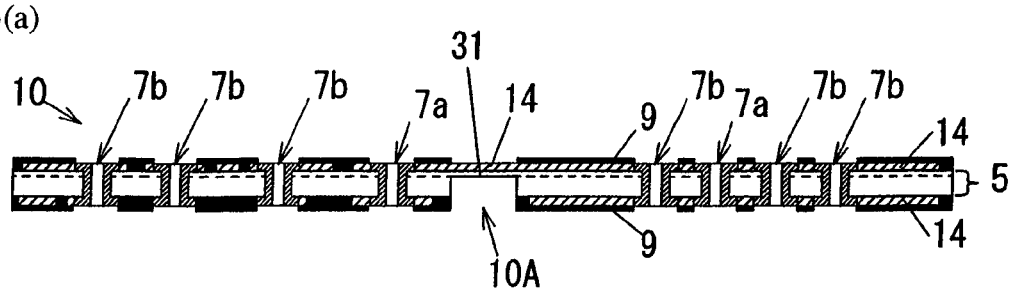
FIGS. 13(a) to 13(d) are sectional views which explain a method of manufacturing a substrate circuit in which connection terminals are provided at prescribed positions in a bending rigid printed wiring board.

Incidentally, when the substrate in which the front surface of the bent portion 10A is coated with the resist 9 is bent in the above-described bent portion 10A, cracking and the like may occur in the resist 9 which coats the bent portion 10A due to stresses applied during the bending and, therefore, the front surface of the bent portion 10A of the rigid printed wiring board 10 shown in FIG. 13(a) is not coated with the resist 9.

Figure 13B:
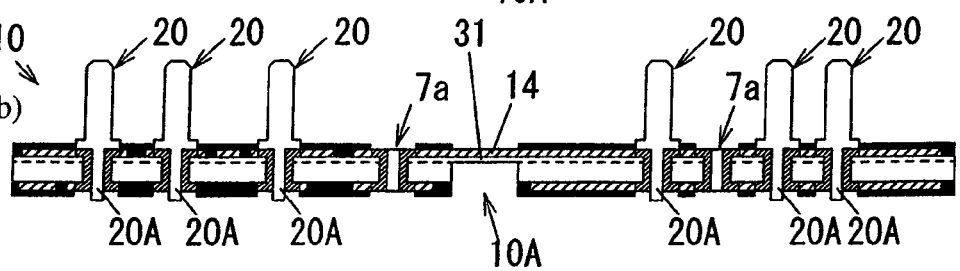
Figure 13C:
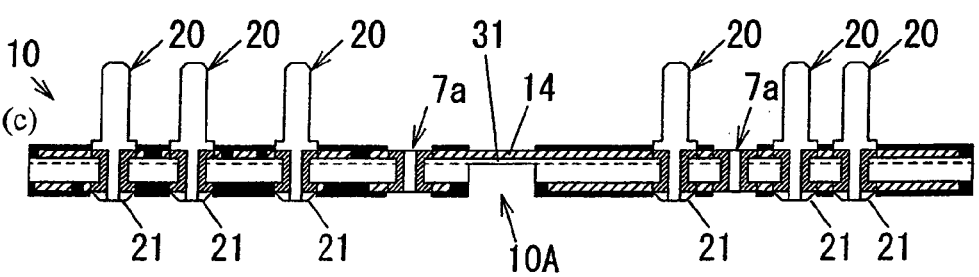
Figure 13D:
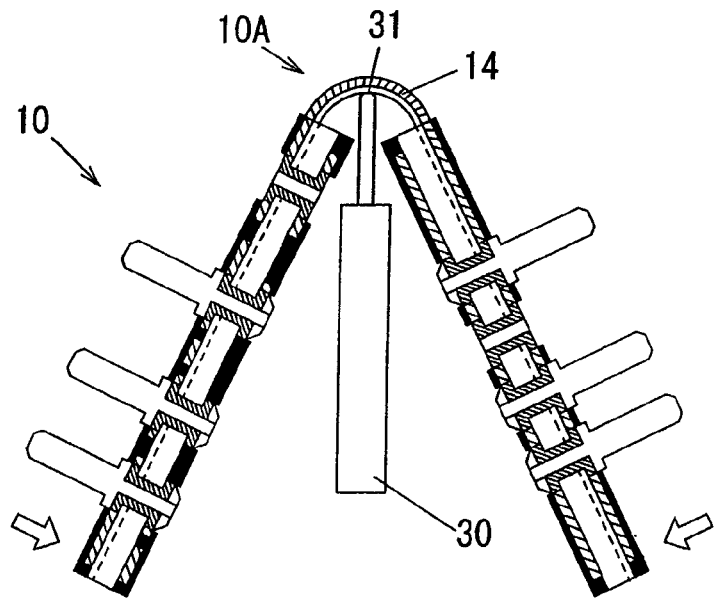

And in this embodiment, after the connection terminals 20 are press fitted into the mounting through holes 7b and the connection terminals 20 are provided at prescribed positions on the front surface of the rigid printed wiring board 10 (refer to FIG. 13(b)), on the rear surface of the rigid printed wiring board 10 leading end portions 20A of the press-fitted connection terminals 20 are soldered 21, whereby the connection terminals 20 are fixed to the rigid printed wiring board 10 (refer to FIG. 13(c)).

After that, by bending the bent portion 10A of the rigid printed wiring board 10 in which the connection terminals 20 are provided at prescribed positions on the front surface by use of a bending jig 30, it is possible to easily manufacture a substrate circuit in which the connection terminals 20 are provided at prescribed positions on both surfaces as shown in FIG. 13(a).

Incidentally, it is also possible to adopt the following method. That is, a circuit 14, via through holes 7a, and mounting through holes 7b are formed in a laminate 6 which is obtained by laminating a copper layer 4 on a hard core material 1 in which a heat resistant resin material 2 is buried in a gap portion 1A, the connection terminals 20 are press fitted into the above-described mounting through holes 7b and soldered, whereby the connection terminals 20 are provided at prescribed positions on the front surface. After that, the heat resistant resin material 2 buried in the above-described gap portion 1A is removed and a bent portion 10A which is obtained by partially reducing the thickness of the hard base material 5 is formed and the rigid printed wiring board 10 is bent thereafter in the above-described bent portion 10A, whereby a substrate circuit in which the connection terminals 20 are provided at prescribed positions on both surfaces is manufactured.

Figure 14A:
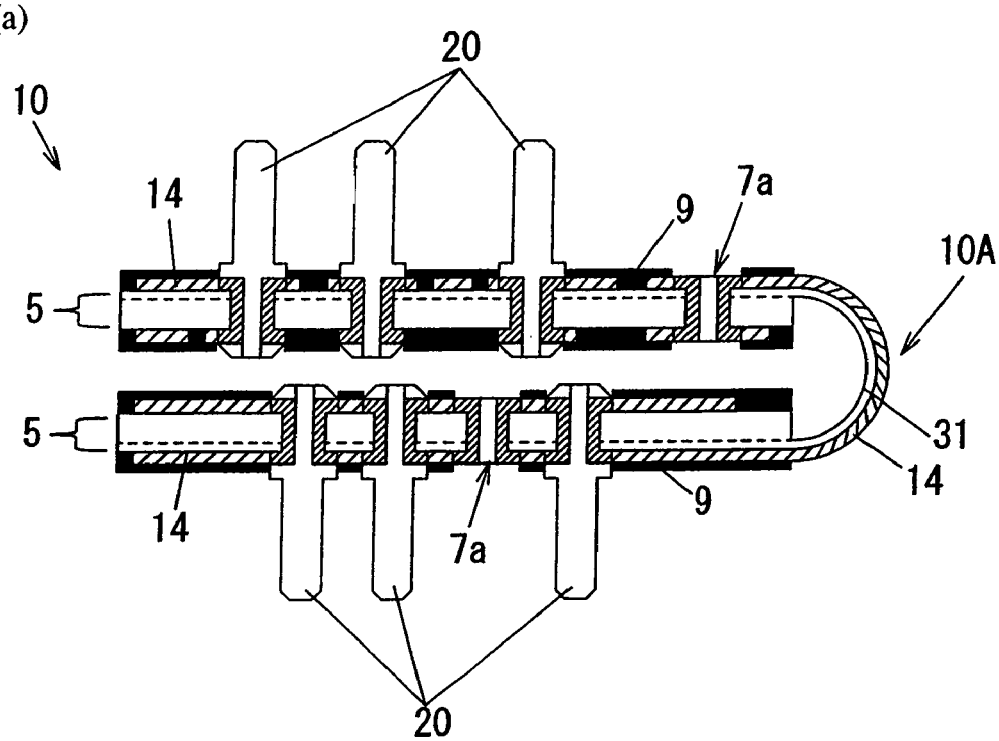
FIGS. 14(a) and 14(b) are sectional views of a substrate circuit in which connection terminals are provided at prescribed positions.

The substrate circuit shown in FIG. 14(a) is fabricated by bending a rigid printed wiring board 10, in which the connection terminals 20 are provided at prescribed positions on the front surface, in the bent portion 10A. Therefore, the degree of freedom of the positions of the connection terminals 20 which are provided at prescribed positions on the front surface and the rear surface is high and besides it is necessary only that the soldering step for fixing the connection terminals 20 to the substrate be performed once. Furthermore, for the circuits which are formed in the substrate (base material 5) which is arranged, with the bent portion 10A interposed, electrical connection is ensured by the circuit 14 formed on the front surface of the bent portion 10A.

Figure 14B:
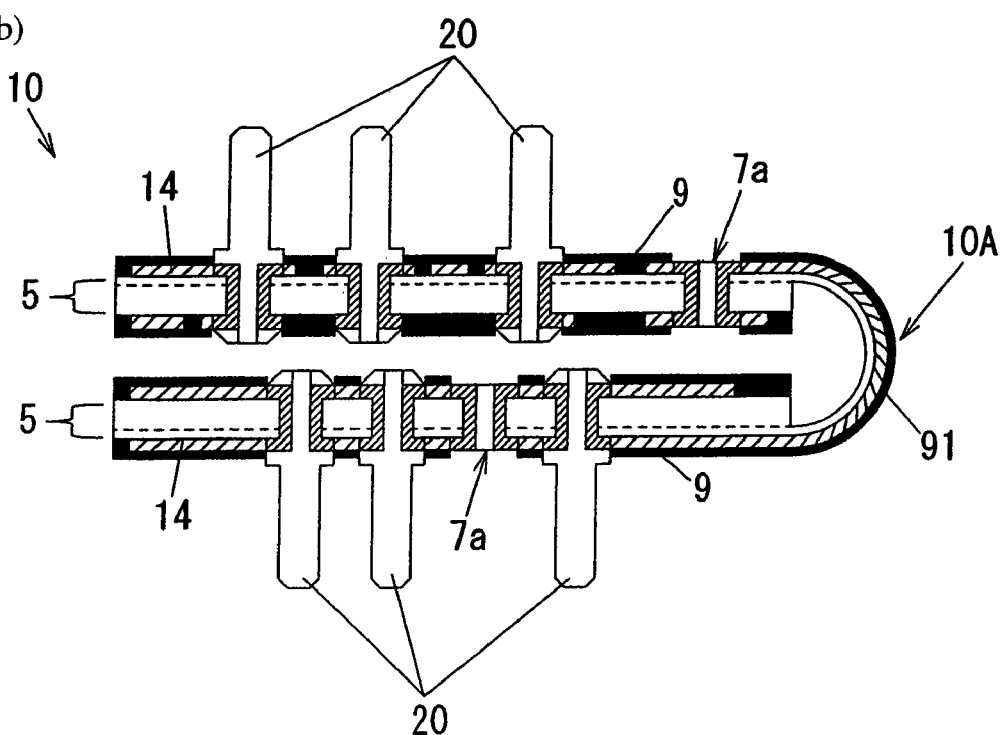
Figure 15A:
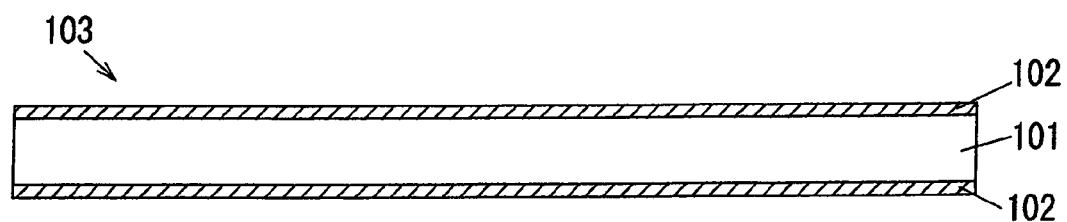
FIGS. 15(a) to 15(c) are sectional views which explain a method of manufacturing a rigid printed wiring board by prior art.
Figure 15B:
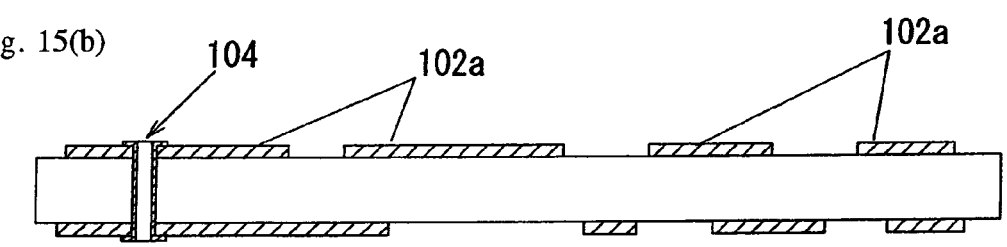
Figure 15C:
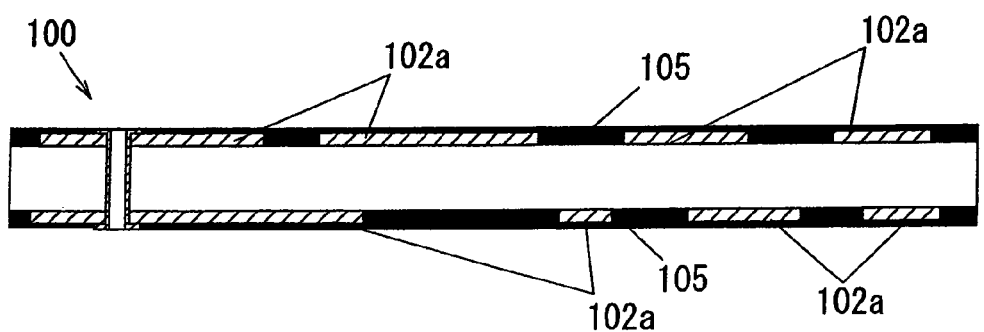
Figure 17A:
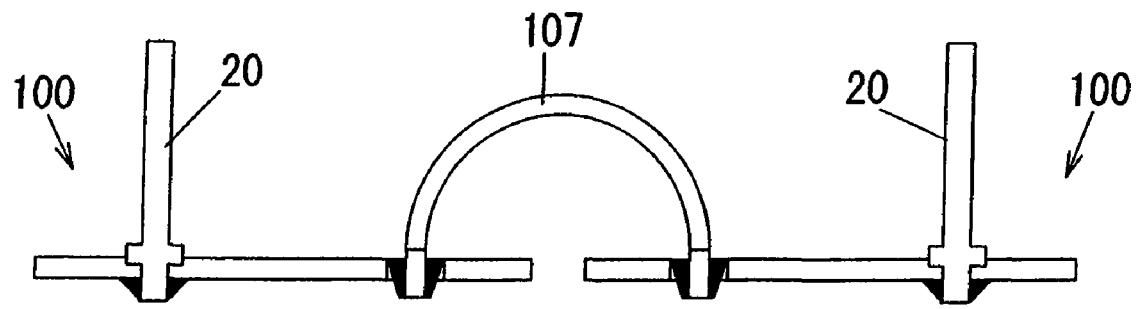
FIGS. 17(a) and 17(b) are diagrams which show other examples of the method shown in FIGS. 15(a) to 15(c).
Figure 17B:
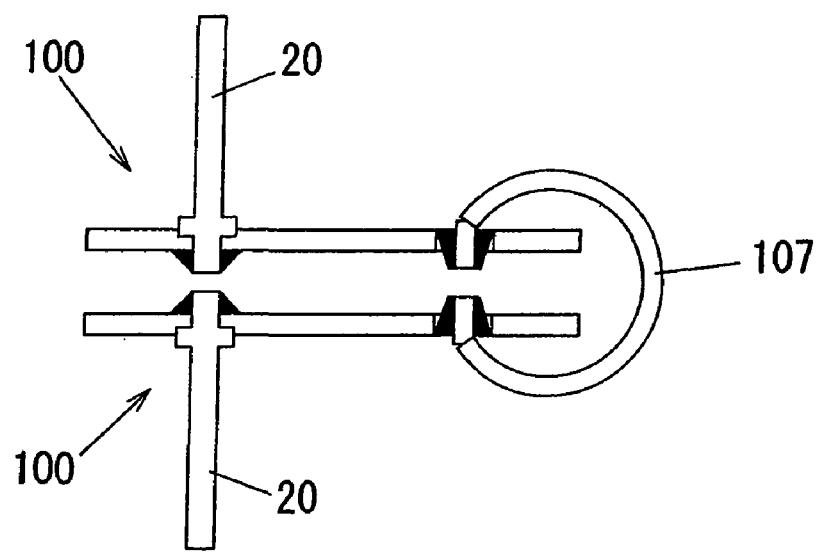

Furthermore, in the substrate circuit shown in FIG. 14(b), after a rigid printed wiring board 10 in which the connection terminals 20 are provided at prescribed positions on the front surface, is bent in the bent portion 10A, an insulating film 91 is provided on the front surface of the bent portion 10A.

In this embodiment, in order to prevent cracking and the like from occurring in the resist 9 due to stresses applied during the bending, the rigid printed wiring board in which the bent portion 10A is not coated with the resist 9 was bent, and after that, the insulating film 91 was provided on the front surface of the bent portion 10A in order to protect the circuit 14 formed on the front surface of the above-described bent portion 10A.

The invention claimed is:

1. A method of manufacturing a rigid printed wiring board which is bendable, comprising
    a step of embedding a heat resistant resin material in a gap portion provided in a hard core material,
    a step of forming a laminate by laminating respective conductor layers on a front surface and a rear surface of the hard core material via respective heat resistant layers, wherein the heat resistant layer on the rear surface is or is not laminated over the heat resistant resin material, and hot pressing the laminate
    a step of forming respective circuits at the front surface and the rear surface of the wiring board by etching the conductor layers and removing that portion of the conductor layers overlying the gap portion on the rear surface of the hard core material, and
    a step of removing the heat resistant resin material embedded in the gap portion along with that portion, if any, of the heat resistant layer, overlying the gap portion on the rear surface of the hard core material, whereby the wiring board is bendable at the gap.

2. A method according to claim 1, further comprising, prior to the step of forming the laminate,
    a step of manufacturing one of the conductor layers to be non-uniform thickness so as to comprise at least one portion of thickness less than thickness of at least one other portion, comprising providing a plate of conductor having a hole portion, filling the hole portion with a conductor laminate material of same thickness as the plate, the conductor laminate material comprising conductor sheet material of lesser thickness than the plate of conductor and laminated on a front surface of an insulating base material,
    and wherein the conductor layer of non-uniform thickness thereby formed comprises one of the conductor layers in the step of forming a laminate.

* * * * *